(12) United States Patent
Yuan et al.

(10) Patent No.: US 12,148,388 B2
(45) Date of Patent: Nov. 19, 2024

(54) LIGHT-EMITTING CONTROL SHIFT REGISTER AND METHOD FOR CONTROLLING THE SAME, GATE DRIVING CIRCUIT, DISPLAY APPARATUS AND METHOD FOR CONTROLLING THE SAME

(71) Applicants: Hefei BOE Joint Technology Co., Ltd., Anhui (CN); BOE TECHNOLOGY GROUP CO., LTD., Beijing (CN)

(72) Inventors: Zhidong Yuan, Beijing (CN); Yongqian Li, Beijing (CN); Pan Xu, Beijing (CN); Can Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/921,677

(22) PCT Filed: Nov. 8, 2021

(86) PCT No.: PCT/CN2021/129312
§ 371 (c)(1),
(2) Date: Oct. 27, 2022

(87) PCT Pub. No.: WO2022/237095
PCT Pub. Date: Nov. 17, 2022

(65) Prior Publication Data
US 2024/0233650 A1    Jul. 11, 2024

(30) Foreign Application Priority Data

May 11, 2021   (CN) .......................... 202110513516.6

(51) Int. Cl.
*G09G 3/3266* (2016.01)
*G09G 3/20* (2006.01)
(Continued)

(52) U.S. Cl.
CPC ......... *G09G 3/3266* (2013.01); *G09G 3/2096* (2013.01); *G09G 3/3233* (2013.01);
(Continued)

(58) Field of Classification Search
CPC .. G09G 3/3266; G09G 3/2096; G09G 3/3233; G09G 2300/0819;
(Continued)

(56) References Cited

U.S. PATENT DOCUMENTS

2012/0081409 A1\*   4/2012   Chung ................ G09G 3/3266
                                                                327/108
2015/0015558 A1    1/2015   Sasaki et al.
(Continued)

FOREIGN PATENT DOCUMENTS

CN        104835450 A      8/2015
CN        105609041 A      5/2016
(Continued)

OTHER PUBLICATIONS

First Office Action for Chinese Patent Application No. 202110513516.6 issued by the Chinese Patent Office on Feb. 24, 2022.
(Continued)

*Primary Examiner* — Amare Mengistu
*Assistant Examiner* — Sosina Abebe
(74) *Attorney, Agent, or Firm* — IP & T GROUP LLP

(57) ABSTRACT

A light-emitting control shift register includes an input circuit, a pulse width adjustment circuit, a pull-up circuit, a pull-down control circuit and a pull-down circuit. The input circuit is configured to output a signal of a first signal input terminal. The pulse width adjustment circuit is configured to
(Continued)

transmit the signal output from the input circuit to a pull-up node, and is further configured to output a signal of a second clock signal terminal to the pull-up node. The pull-up circuit is configured to output a voltage of a first voltage terminal to a signal output terminal. The pull-down control circuit is configured to output the voltage of the first voltage terminal, and is further configured to output a voltage of a second voltage terminal. The pull-down circuit is configured to pull down a voltage of the signal output terminal to the voltage of the second voltage terminal.

20 Claims, 11 Drawing Sheets

(51) Int. Cl.
*G09G 3/3233* (2016.01)
*G11C 19/28* (2006.01)

(52) U.S. Cl.
CPC ..... *G11C 19/28* (2013.01); *G09G 2300/0819* (2013.01); *G09G 2300/0842* (2013.01); *G09G 2310/0286* (2013.01); *G09G 2310/08* (2013.01); *G09G 2340/00* (2013.01)

(58) Field of Classification Search
CPC ... G09G 2300/0842; G09G 2310/0286; G09G 2310/08; G11C 19/28
See application file for complete search history.

(56) References Cited

U.S. PATENT DOCUMENTS

| | | |
|---|---|---|
| 2016/0267868 A1 | 9/2016 | Choi |
| 2017/0116926 A1* | 4/2017 | Bong .................... G09G 3/3266 |
| 2017/0200419 A1* | 7/2017 | Ma .......................... G11C 19/28 |
| 2019/0103166 A1* | 4/2019 | Yuan ..................... G11C 19/184 |
| 2020/0143730 A1* | 5/2020 | Zheng ...................... G09G 3/20 |
| 2020/0152283 A1 | 5/2020 | Qing |
| 2022/0020324 A1* | 1/2022 | Yuan ...................... G11C 19/28 |
| 2022/0343858 A1 | 10/2022 | Feng et al. |

FOREIGN PATENT DOCUMENTS

| | | |
|---|---|---|
| CN | 105976774 A | 9/2016 |
| CN | 106157919 A | 11/2016 |
| CN | 106991945 A | 7/2017 |
| CN | 207489447 U | 6/2018 |
| CN | 110176217 A | 8/2019 |
| CN | 111445833 A | 7/2020 |
| CN | 111599315 A | 8/2020 |
| CN | 111710302 A | 9/2020 |
| CN | 113192463 A | 7/2021 |
| KR | 10-2016-0135456 A | 11/2016 |
| WO | 2013/146058 A1 | 10/2013 |

OTHER PUBLICATIONS

Notification to Grant Patent Right for Invention for Chinese Patent Application No. 202110513516.6 issued by the Chinese Patent Office on Aug. 2, 2022.

* cited by examiner

LIGHT-EMITTING CONTROL SHIFT REGISTER AND METHOD FOR CONTROLLING THE SAME, GATE DRIVING CIRCUIT, DISPLAY APPARATUS AND METHOD FOR CONTROLLING THE SAME

CROSS-REFERENCE TO RELATED APPLICATIONS

This application is a national phase entry under 35 USC 371 of International Patent Application No. PCT/CN 2021/129312 filed on Nov. 8, 2021, which claims priority to Chinese Patent Application No. 202110513516.6, filed on May 11, 2021, which are incorporated herein by reference in their entirety.

TECHNICAL FIELD

The present disclosure relates to the field of display technologies, and in particular, to a light-emitting control shift register and a method for controlling the same, a gate driving circuit, a display apparatus and a method for controlling the same.

BACKGROUND

In recent years, with continuous improvement of a manufacturing process of an amorphous silicon thin film transistor (TFT) or an oxide TFT, the GOA (gate driver on array) technology has attracted more and more attention. The GOA technology is helpful to realize a narrow bezel of a display panel, and may reduce production costs of the display panel. The GOA technology means that gate driving circuit(s) are directly integrated on an array substrate, and supply corresponding gating signals and light-emitting signals to pixel circuits in the array substrate. In addition, in a case where the pixel circuits are turned on by the gating signals, a data driving circuit may supply data signals to the pixel circuits through data signal lines, so as to form gray scale voltages required for gray scales of a display image in pixel units, thereby displaying a frame of image.

SUMMARY

In an aspect, a light-emitting control shift register is provided. The light-emitting control shift register includes an input circuit, a pulse width adjustment circuit, a pull-up circuit, a pull-down control circuit and a pull-down circuit. The input circuit is electrically connected to a first signal input terminal and a first clock signal terminal. The input circuit is configured to output a signal of the first signal input terminal under a control of a signal from the first clock signal terminal. The pulse width adjustment circuit is electrically connected to the input circuit, an enable signal terminal, a second signal input terminal, a second clock signal terminal and a pull-up node. The pulse width adjustment circuit is configured to transmit the signal output from the input circuit to the pull-up node under a control of a signal from the enable signal terminal. The pulse width adjustment circuit is further configured to output a signal of the second clock signal terminal to the pull-up node under a control of a signal from the second signal input terminal. The pull-up circuit is electrically connected to the pull-up node, a first voltage terminal and a signal output terminal. The pull-up circuit is configured to output a voltage of the first voltage terminal to the signal output terminal under a control of the pull-up node. The pull-down control circuit is electrically connected to the first clock signal terminal, the first voltage terminal, the pull-up node and a second voltage terminal. The pull-down control circuit is configured to output the voltage of the first voltage terminal under a control of signals from the pull-up node, the first clock signal terminal and the first voltage terminal. The pull-down control circuit is further configured to output a voltage of the second voltage terminal under the control of the pull-up node. The pull-down circuit is electrically connected to the pull-down control circuit, the signal output terminal and the second voltage terminal. The pull-down circuit is configured to pull down a voltage of the signal output terminal to the voltage of the second voltage terminal under a control of the voltage from the first voltage terminal.

In some embodiments, the light-emitting control shift register further includes a pull-up control circuit electrically connected to the first voltage terminal, the pull-up node and a pull-up control signal terminal. The pull-up control circuit is configured to output the voltage of the first voltage terminal to the pull-up node under a control of a signal from the pull-up control signal terminal.

In some embodiments, the input circuit includes a first transistor. A first electrode of the first transistor is electrically connected to the first signal input terminal, and a gate of the first transistor is electrically connected to the first clock signal terminal.

In some embodiments, the pulse width adjustment circuit includes a first pulse width adjustment sub-circuit and a second pulse width adjustment sub-circuit. The first pulse width adjustment sub-circuit is electrically connected to the input circuit, the enable signal terminal and the pull-up node. The first pulse width adjustment sub-circuit is configured to transmit the signal output from the input circuit to the pull-up node under the control of the signal from the enable signal terminal. The second pulse width adjustment sub-circuit is electrically connected to the second signal input terminal, the second clock signal terminal and the pull-up node. The second pulse width adjustment sub-circuit is configured to output the signal of the second clock signal terminal to the pull-up node under the control of the signal from the second signal input terminal.

In some embodiments, the first pulse width adjustment sub-circuit includes a second transistor. A first electrode of the second transistor is electrically connected to a second electrode of the first transistor, a second electrode of the second transistor is electrically connected to the pull-up node, and a gate of the second transistor is electrically connected to the enable signal terminal.

In some embodiments, the second pulse width adjustment sub-circuit includes a third transistor. A first electrode of the third transistor is electrically connected to the second clock signal terminal, a second electrode of the third transistor is electrically connected to the pull-up node, and a gate of the third transistor is electrically connected to the second signal input terminal.

In some embodiments, the pull-down control circuit includes a first pull-down control sub-circuit and a second pull-down control sub-circuit. The first pull-down control sub-circuit is electrically connected to the first clock signal terminal, the first voltage terminal and the second pull-down control sub-circuit. The first pull-down control sub-circuit is configured to output the voltage of the first voltage terminal under a control of the signals from the first clock signal terminal and the first voltage terminal when the second pull-down control sub-circuit is turned off. The second pull-down control sub-circuit is further electrically connected to the pull-up node and the second voltage terminal. The second pull-down control sub-circuit is configured to be turned off under a control of the signal from the pull-up node, and output the voltage of the second voltage terminal under the control of the pull-up node.

In some embodiments, the first pull-down control sub-circuit includes a fourth transistor and a fifth transistor. A first electrode of the fourth transistor is electrically connected to the first clock signal terminal, and a gate of the fourth transistor is electrically connected to the first voltage terminal. A first electrode of the fifth transistor is electrically connected to the first voltage terminal, and a gate of the fifth transistor is electrically connected to a second electrode of the fourth transistor.

In some embodiments, the second pull-down control sub-circuit includes a sixth transistor and a seventh transistor. A first electrode of the sixth transistor is electrically connected to the second electrode of the fourth transistor, a second electrode of the sixth transistor is electrically connected to the second voltage terminal, and a gate of the sixth transistor is electrically connected to the pull-up node. A first electrode of the seventh transistor is electrically connected to a second electrode of the fifth transistor, a second electrode of the seventh transistor is electrically connected to the second voltage terminal, and a gate of the seventh transistor is electrically connected to the pull-up node.

In some embodiments, the pull-up circuit includes an eighth transistor and a first capacitor. A first electrode of the eighth transistor is electrically connected to the first voltage terminal, a second electrode of the eighth transistor is electrically connected to the signal output terminal, and a gate of the eighth transistor is electrically connected to the pull-up node. A first electrode of the first capacitor is electrically connected to the pull-up node, and a second electrode of the first capacitor is electrically connected to the signal output terminal.

In some embodiments, the pull-down circuit includes a ninth transistor and a second capacitor. A first electrode of the ninth transistor is electrically connected to the second voltage terminal, a second electrode of the ninth transistor is electrically connected to the signal output terminal, and a gate of the ninth transistor is electrically connected to the second electrode of the fifth transistor. A first electrode of the second capacitor is electrically connected to the gate of the ninth transistor, and a second electrode of the second capacitor is electrically connected to the second voltage terminal.

In some embodiments, the pull-up control circuit includes a tenth transistor. A first electrode of the tenth transistor is electrically connected to the first voltage terminal, a second electrode of the tenth transistor is electrically connected to the pull-up node, and a gate of the tenth transistor is electrically connected to the pull-up control signal terminal.

In another aspect, a gate driving circuit is provided. The gate driving circuit includes N light-emitting control shift registers described above. N is an integer greater than or equal to 2. A first signal input terminal of a first stage light-emitting control shift register is electrically connected to a first start signal terminal. A first signal input terminal of a light-emitting control shift register except the first stage light-emitting control shift register is electrically connected to a signal output terminal of a previous stage light-emitting control shift register.

In yet another aspect, a display apparatus is provided. The display apparatus includes a plurality of pixel circuits arranged in an array, a first gate driving circuit and a second gate driving circuit. The pixel circuits each have a light-emitting control terminal and a gating signal terminal. The first gate driving circuit is the above gate driving circuit. A signal output terminal of each light-emitting control shift register in the first gate driving circuit is electrically connected to light-emitting control terminals in a same row of pixel circuits. The second gate driving circuit includes N gating control shift registers that are cascaded. An output terminal of each gating control shift register is electrically connected to gating signal terminals in a same row of pixel circuits. N is an integer greater than or equal to 2. An output terminal of a gating control shift register except a first stage gating control shift register is electrically connected to a second signal input terminal of a previous stage light-emitting control shift register.

In some embodiments, the display apparatus further includes a central processor for obtaining moving picture data and static picture data of an image to be displayed, and a timing controller for supplying each light-emitting control shift register with input signals, an enable signal and a clock control signal according to the moving picture data and the static picture data.

In yet another aspect, a method for controlling the light-emitting control shift register in any one of the above embodiments is provided. An image frame includes a first charging phase, a charging hold phase, a discharging phase, a pulse width adjustment phase and a second charging phase. The method for controlling the light-emitting control shift register includes following steps. In the first charging phase, the input circuit outputs the signal of the first signal input terminal under the control of the signal from the first clock signal terminal; the pulse width adjustment circuit transmits the signal output from the input circuit to the pull-up node under the control of the signal from the enable signal terminal; the pull-up circuit outputs the voltage of the first voltage terminal to the signal output terminal under the control of the pull-up node. In the charging hold phase, the pull-up circuit continuously outputting the voltage of the first voltage terminal to the signal output terminal under the control of the pull-up node. In the discharging phase, the input circuit outputs the signal of the first signal input terminal under the control of the signal from the first clock signal terminal; the pulse width adjustment circuit transmits the signal output from the input circuit to the pull-up node under the control of the signal from the enable signal terminal; the pull-down control circuit outputs the voltage of the first voltage terminal under the control of the signals from the pull-up node, the first clock signal terminal and the first voltage terminal; the pull-down circuit pulls down the voltage of the signal output terminal to the voltage of the second voltage terminal under the control of the voltage from the first voltage terminal. In the pulse width adjustment phase, the pulse width adjustment circuit transmits the signal output from the input circuit to the pull-up node under the control of the signal from the enable signal terminal; the pulse width adjustment circuit further outputs the signal of the second clock signal terminal to the pull-up node under the control of the signal from the second signal input terminal. In the second charging phase, the input circuit outputs the signal of the first signal input terminal under the control of the signal from the first clock signal terminal; the pulse width adjustment circuit transmits the signal output from the input circuit to the pull-up node under the control of the signal from the enable signal terminal; the pull-up circuit outputs the voltage of the first voltage terminal to the signal output terminal under the control of the pull-up node.

In yet another aspect, a method for controlling the display apparatus in any one of the above embodiments is provided. The control method includes the method for controlling each light-emitting control shift register. In the pulse width adjustment phase, before controlling each light-emitting control shift register, the method for controlling the display apparatus further includes: determining that display data received by each row of pixel circuits is moving picture data or static picture data; and when display data received by a currently scanned row of pixel circuits 30 is converted from static picture data to moving picture data, adjusting a pulse width of an enable signal supplied to a light-emitting control shift register electrically connected to the currently scanned row of pixel circuits, so that a non-effective duration of the enable signal in a current frame is greater than a non-effective duration of the enable signal in a previous frame. In the pulse width adjustment phase, the method for controlling each light-emitting control shift register includes: in the current frame, for the light-emitting control shift register electrically connected to the currently scanned row of pixel circuits, transmitting, by a pulse width adjustment circuit, an signal output from an input circuit to a pull-up node under a control of the enable signal from an enable signal terminal. In the second charging phase, the method for controlling each light-emitting control shift register includes: for each light-emitting control shift register, outputting, by a pull-up circuit, a voltage of a first voltage terminal to the signal output terminal under a control of a pull-up node, so that a non-effective duration of a signal output from a signal output terminal of the light-emitting control shift register electrically connected to the currently scanned row of pixel circuits is greater than a non-effective duration of a signal output from a signal output terminal of a light-emitting control shift register electrically connected to a previously scanned row of pixel circuits.

In yet another aspect, a method for controlling the display apparatus in any one of the above embodiments is provided. The control method includes the method for controlling each light-emitting control shift register. In the pulse adjustment phase, before controlling each light-emitting control shift register, the method for controlling the display apparatus further includes: determining that display data received by each row of pixel circuits is moving picture data or static picture data; and when display data received by a currently scanned row of pixel circuits is converted from moving picture data to static picture data, for a light-emitting control shift register electrically connected to the currently scanned row of pixel circuits, controlling a second signal input terminal to output an effective gating signal and a second clock signal terminal to output an effective clock control signal. In the pulse width adjustment phase, the method for controlling each light-emitting control shift register includes: in a current frame, for the light-emitting control shift register electrically connected to the currently scanned row of pixel circuits, outputting, by a pulse width adjustment circuit, the clock control signal of the second clock signal terminal to a pull-up node under a control of the gating signal from the second signal input terminal. In the second charging phase, the method for controlling each light-emitting control shift register includes: for each light-emitting control shift register, outputting, by a pull-up circuit, a voltage of a first voltage terminal to the signal output terminal under a control of a pull-up node, so that a non-effective duration of a signal output from a signal output terminal of the light-emitting control shift register electrically connected to the currently scanned row of pixel circuits is less than a non-effective duration of a signal output from a signal output terminal of a light-emitting control shift register electrically connected to a previously scanned row of pixel circuits.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1:
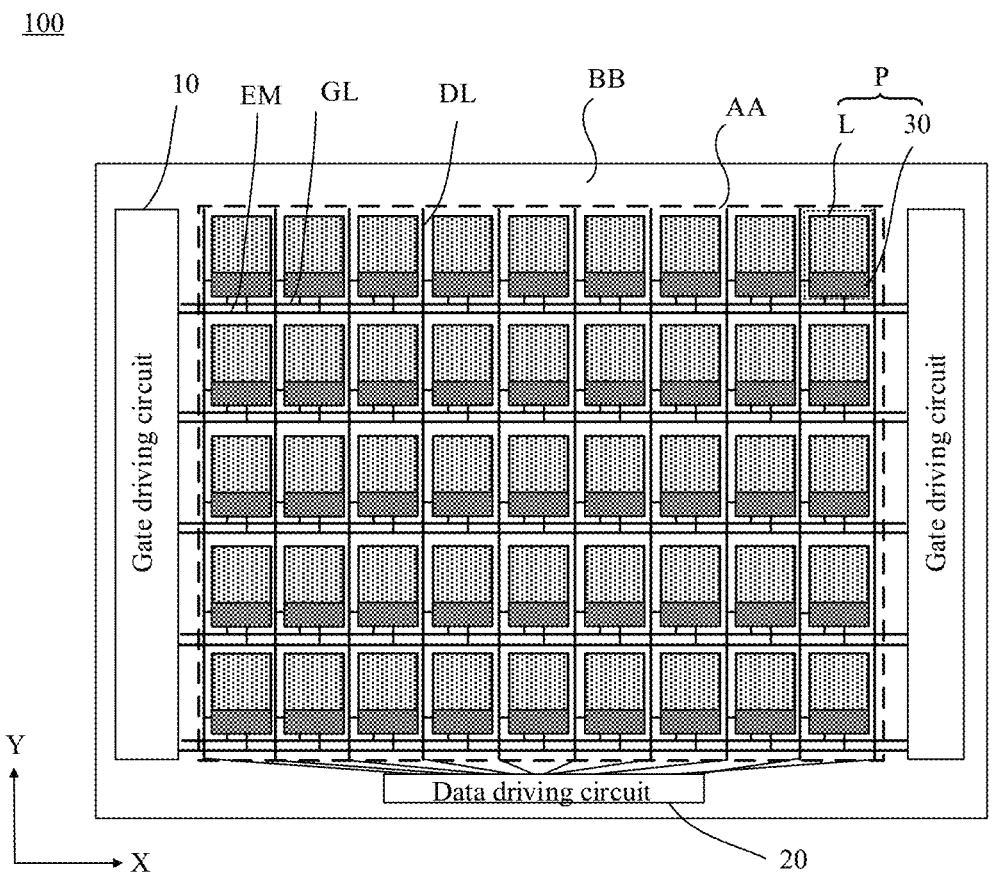
FIG. 1 is a structural diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic designations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. For another example, the term "electrically connected" may be used in the description of some embodiments to indicate that two or more components are directly electrically connected to each other, or are indirectly electrically connected through a certain intermediate medium.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C. The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

The embodiments of the present disclosure provide a display apparatus. The display apparatus may be a television, a mobile phone, a computer, a notebook computer, a tablet computer, a personal digital assistant (PDA), or a vehicle-mounted computer. The display apparatus may include a frame, and a display panel, a circuit board, a display driving integrated circuit (IC) and other electronic accessories that are all disposed in the frame.

The display apparatus may be a self-luminous display apparatus, such as an organic light-emitting diode (OLED) display apparatus or a quantum dot light-emitting diode (QLED) display apparatus, but is not specifically limited thereto.

OLEDs, as current light-emitting devices, are increasingly used in high-performance display fields due to their characteristics of self-luminescence, fast response, wide viewing angle and capability of being manufactured on a flexible substrate. Following embodiments of the present disclosure will be described in an example where the display apparatus is the OLED display apparatus.

As shown in FIG. 1, the display apparatus 100 may have a display area (also referred to as active area, AA) and a peripheral area BB located on at least one side of the display area AA. FIG. 1 exemplarily illustrates that the peripheral area BB surrounds the display area AA, but is not limited thereto.

On this basis, as shown in FIG. 1, the display apparatus 100 may include a plurality of sub-pixels P located in the display area AA. Each sub-pixel P includes a pixel circuit 30 and a light-emitting device L electrically connected to the pixel circuit 30. The pixel circuit 30 may drive the light-emitting device L to emit light. In a case where the display apparatus 100 is the OLED display apparatus, the light-emitting device L in the sub-pixel P may be an OLED. In this case, OLEDs in the plurality of sub-pixels P may emit light of at least three primary colors, such as red (R), green (G) and blue (B).

For the convenience of description, as an example, the plurality of sub-pixels P are arranged in an array. In this case, sub-pixels P arranged in a line along a horizontal direction X are referred to as a same row of sub-pixels, and sub-pixels P arranged in a line along a vertical direction Y are referred to as a same column of sub-pixels.

As shown in FIG. 1, pixel circuits 30 in a same row of sub-pixels P may be electrically connected to a same light-emitting control signal line (also referred to as emission control signal line, EM), and may also be electrically connected to a same gating signal line (also referred to as gate line, GL). In addition, pixel circuits 30 in a same column of sub-pixels P may be electrically connected to a same data signal line (also referred to as data line, DL).

Referring to FIG. 1 again, it can be seen that gate driving circuit(s) 10 and a data driving circuit 20 may be provided in the peripheral area BB of the display apparatus 100. The gate driving circuit(s) 10 may supply, for example, gating signals Vgate for row-by-row scanning to pixel circuits 30 in the plurality of sub-pixels P arranged in the array in the display area AA through a plurality of gating signal lines GL. The gating signals Vgate are used for turning on the pixel circuits 30, so that data signals Vdata supplied from the data driving circuit 20 are able to be input to the turned-on pixel circuits 30 through a plurality of data signal lines DL.

In addition, the gate driving circuit(s) 10 may further supply light-emitting signals to the pixel circuits 30 in the display area AA through a plurality of light-emitting control signal lines EM. The light-emitting signals are used for controlling the pixel circuits 30 to output respective driving currents I to the light-emitting devices L respectively electrically connected to the pixel circuits 30, so as to drive the light-emitting devices L to emit light.

It can be seen from the above that the OLED device is a current control device, and a magnitude of the driving current I flowing through the OLED device may determine a light-emitting brightness of the OLED. The magnitude of the driving current I may be determined by a magnitude of the data signal Vdata. Therefore, the light-emitting brightness of the OLED may be controlled by controlling the magnitude of the data signal Vdata.

In some embodiments of the present disclosure, each film layer in each of transistors constituting the gate driving circuit(s) 10 and a corresponding film layer in each of transistors in the pixel circuits 30 may be manufactured by using a same patterning process. A typical patterning process means that a desired pattern is formed using a mask by a process that includes coating a photoresist on a surface of a film, exposing the photoresist, developing the film after exposure, etching regions of the film exposed by the photoresist to form a specific pattern, and removing the photoresist.

In this way, the gate driving circuit(s) 10 may be integrated on a base substrate when the pixel circuits 30 are manufactured on the same base substrate, so that a bonding process of a gate driving integrated circuit (IC) is omitted, and dependence on the gate driving IC with high costs in the manufacturing process of the display panel is relieved, thereby realizing narrow bezel and low power consumption.

In addition, the above embodiments are described in an example where sub-pixels P arranged in a line along the horizontal direction X are a same row of sub-pixels. A form of the "same row" of sub-pixels P is not specifically limited in the embodiments of the present disclosure, as long as the same row of sub-pixels P are electrically connected to a same light-emitting control signal line EM, and are also electrically connected to a same gating signal line GL. For example, in some other embodiments, the sub-pixels P may be arranged in concentric circles. In this case, sub-pixels P electrically connected to a same light-emitting control signal line EM and located on an arc with the same radius of curvature are referred to as a same row of sub-pixels P.

In some embodiments of the present disclosure, a gate driving circuit 10 may be disposed on a single side of the display area AA in the peripheral area BB, and the gating signal lines GL are driven row by row from the single side, i.e., driven in a single-sided manner. In some other embodiments of the present disclosure, two gate driving circuits 10 may be respectively disposed on two sides of the display area AA in the peripheral area BB in an extending direction of the gating signal lines GL, and the gating signal lines GL are driven by the two gate driving circuits 10 from the two sides in an alternating sequence of odd-numbered rows and even-numbered rows, i.e., driven in an alternating manner. For example, gating signal lines GL in the odd-numbered rows are driven by the gate driving circuit 10 located on a side, and gating signal lines GL in the even-numbered rows are driven by the gating driving circuit 10 located on another side. In yet other embodiments of the present disclosure, two gate driving circuits 10 may be respectively disposed on the two sides of the display area AA in the peripheral area BB AA in the extending direction of the gating signal lines GL, and the gating signal lines GL are driven row by row by the two gating driving circuits 10 from the two sides, i.e., driven in a double-sided manner. For the convenience of description, following embodiments of the present disclosure will be described by taking the double-sided driving as an example.

Figure 2:
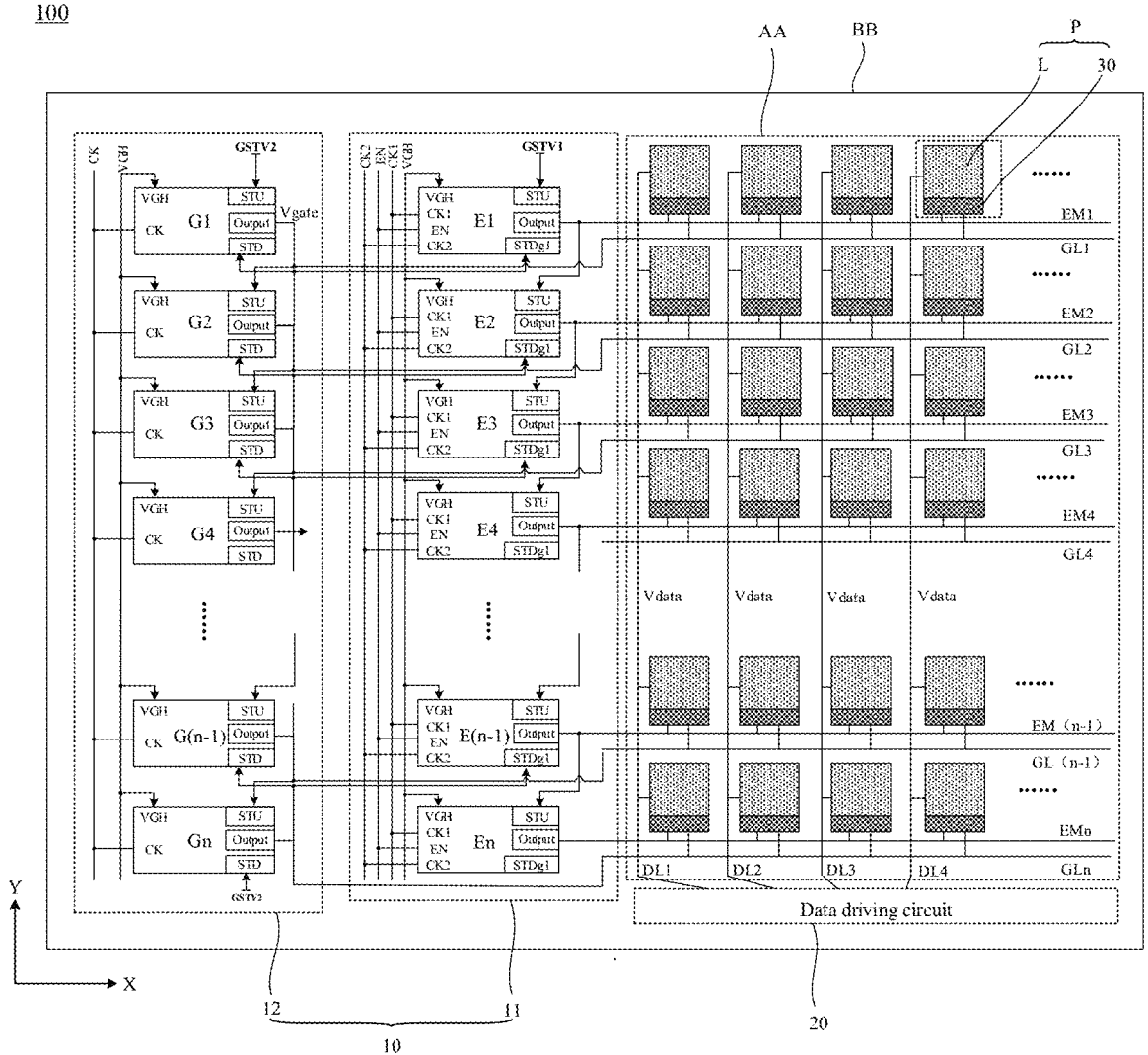
FIG. 2 is a specific structural diagram of the display apparatus shown in FIG. 1.

In some embodiments of the present disclosure, in order to supply the light-emitting signals and the gating signals Vgate to the pixel circuits 30 in the sub-pixels P arranged in the array in the display area AA, as shown in FIG. 2, the gate driving circuit 10 may include a first gate driving circuit 11 and a second gate driving circuit 12. The first gate driving circuit 11 may supply the light-emitting signals to the pixel circuits 30, and the second gate driving circuit 12 may supply the gating signals Vgate to the pixel circuits 30.

It will be noted that FIG. 2 only shows a structure of a gate driving circuit 10 located on a side of the display area AA, and a structure of a gate driving circuit 10 located on another side of the display area AA is similar thereto, and is not shown here for simplicity.

Specific structures of the first gate driving circuit 11 and the second gate driving circuit 12 will be described in detail below. Firstly, the specific structure of the first gate driving circuit 11 will be described.

In some embodiments of the present disclosure, as shown in FIG. 2, the first gate driving circuit 11 may include N light-emitting control shift registers (also referred to as emission control shift registers on array, i.e., EOA registers below). Here, N is an integer greater than or equal to 2 (i.e., N≥2). The N EOA registers may be E1, E2, E3, E4 . . . E(n−1), and En, respectively. Each EOA register may supply a light-emitting signal to pixel circuits 30 in sub-pixels P.

Each EOA register may include a first signal input terminal STU, a second signal input terminal STDg1 and a signal output terminal Output. A first signal input terminal STU of a first stage EOA register E1 may be electrically connected to a first start signal terminal GSTV1 to receive a first start signal from the first start signal terminal GSTV1. A first signal input terminal STU of an EOA register except E1 is electrically connected to a signal output terminal Output of a previous stage EOA register. In addition, a signal output terminal Output of an EOA register is electrically connected to a light-emitting control signal line EM.

In addition, as shown in FIG. 2, each EOA register (e.g., E1) may further include a first clock signal terminal CK1, a second clock signal terminal CK2, a first voltage terminal VGH, an enable signal terminal EN and a second voltage terminal (not shown in FIG. 2). In the circuit of the EOA register, the first clock signal terminal CK1 may transmit a first clock signal, the second clock signal terminal CK2 may transmit a second clock signal, the first voltage terminal VGH may transmit a first voltage, the second voltage terminal may transmit a second voltage, and the enable signal terminal may transmit an enable signal.

The EOA register may output the light-emitting signal from the signal output terminal Output to the pixel circuits 30 under a common control of the first clock signal, the second clock signal and the enable signal.

It will be noted that in some embodiments of the present disclosure, the enable signal terminal of each EOA register is electrically connected to an enable signal line to receive an enable signal supplied from this enable signal line in an image frame.

In some embodiments of the present disclosure, as shown in FIG. 2, the second gate driving circuit 12 may include N gating control shift registers (also referred to as gating control shift registers on array, i.e., GOA registers below) that are cascaded, such as G1, G2, G3, G4 ... G(n−1), and Gn, respectively. Each GOA register may supply a gating signal Vgate to pixel circuits 30 in sub-pixels P.

Each GOA register may include a first input terminal STU, a second input terminal STD and an output terminal Output. A first input terminal STU of a first stage GOA register G1 is electrically connected to a second start signal terminal GSTV2 to receive a second start signal from the second start signal terminal GSTV2. A first input terminal STU of a GOA register except G1 is electrically connected to an output terminal Output of a previous stage GOA register.

In addition, a second input terminal STD of a last stage GOA register is electrically connected to the second start signal terminal or a general reset signal terminal. A second input terminal STD of a GOA register except the last stage GOA register is electrically connected to an output terminal Output of a next stage GOA register. In addition, an output terminal Output of a GOA register (e.g., G3) except G1 is electrically connected to a second signal input terminal STDg1 of a previous stage EOA register (e.g., E2). In addition, an output terminal Output of a GOA register in the second gate driving circuit 12 is further electrically connected to a gating signal line GL.

In addition, as shown in FIG. 2, each GOA register may further include a first voltage terminal VGH and a clock signal terminal CK. The GOA register may output the gating signal Vgate from the output terminal Output under a common control of the second start signal, a clock signal from the clock signal terminal CK and a first voltage from the first voltage terminal VGH. Thus, the gating signal Vgate is transmitted to the pixel circuits 30.

It will be noted that the second start signal transmitted by the second start signal terminal GSTV2 may be different from or the same as the first start signal transmitted by the first start signal terminal GSTV1. Following embodiments will be described in an example where the second start signal is different from the first start signal.

In summary, when the first start signal terminal GSTV1 supplies an effective signal to the first gate driving circuit 11, the first gate driving circuit 11 starts to operate to supply the light-emitting signals to the pixel circuits 30 in the display area AA. In addition, when the second start signal terminal GSTV2 supplies an effective signal to the second gate driving circuit 12, the second gate driving circuit 12 starts to operate to supply the gating signals Vgate to the pixel circuits 30 in the display area AA.

In addition, it can be seen from the above that each sub-pixel p may include the pixel circuit 30 and the light-emitting device L. The pixel circuit 30 may receive a data signal Vdata transmitted by a data signal line DL, a gating signal Vgate transmitted by a gating signal line GL and a light-emitting signal transmitted by a light-emitting control signal line EM, so as to drive the light-emitting device L to emit light under a combined action of the data signal Vdata, the gating signal Vgate and the light-emitting signal, thereby realizing display. A circuit structure of the pixel circuit 30 that may realize the above functions may be, for example, 5T1C, 4T2C, or 7T1C. T represents a transistor, C represents a capacitor, and a number represents the number of transistors or capacitor(s). As an example, 5T1C means that the pixel circuit 30 has five transistors T and a capacitor C.

Figure 3A:
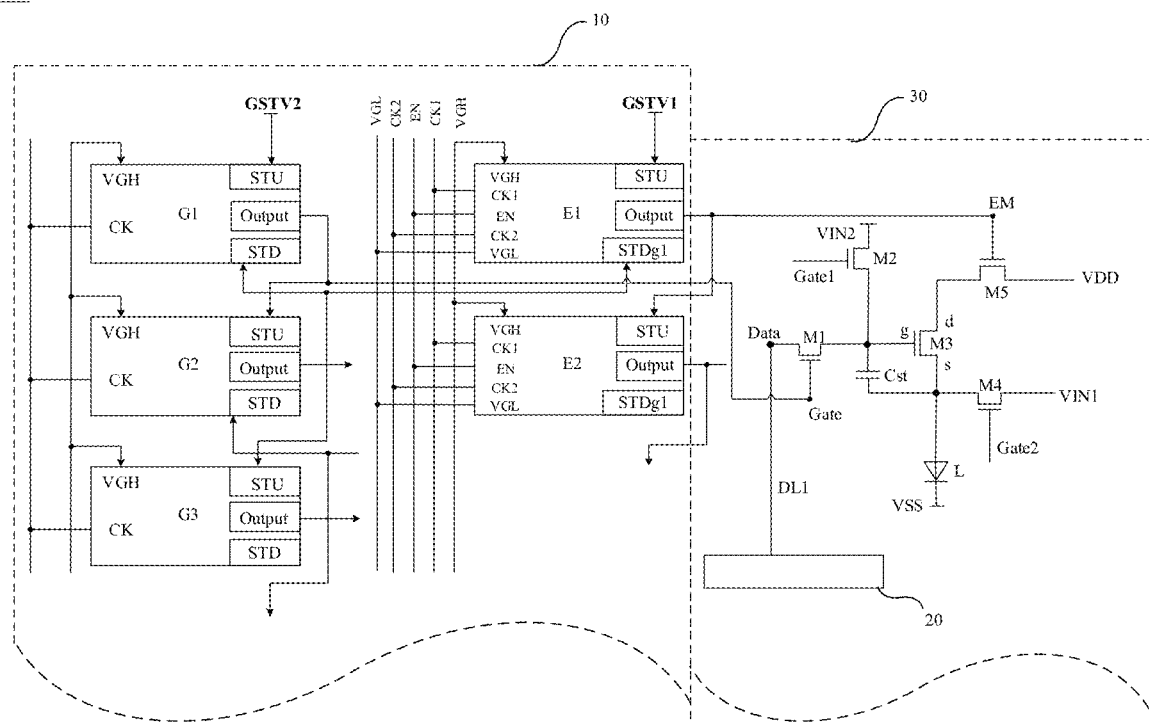
FIG. 3A is a specific structural diagram of a pixel circuit shown in FIG. 2.

For the convenience of description, following embodiments of the present disclosure will be described in an example where the pixel circuit 30 has the 5T1C circuit structure as shown in FIG. 3A (the pixel circuit 30 shown in FIG. 3A is a specific structure of the pixel circuit 30 in FIG. 2). A data signal terminal Data in the pixel circuit 30 is used for receiving a data signal Vdata transmitted by the data driving circuit 20. A gating signal terminal Gate, a first reset terminal Gate1 and a second reset terminal Gate2 each may receive a gating signal Vgate. A light-emitting control terminal EM is used for receiving a light-emitting signal output from an EOA register.

It will be noted that whether the gating signal terminal Gate, the first reset terminal Gate1, or the second reset terminal Gate2 is connected to the GOA register is not limited in the embodiments of the present disclosure, and FIG. 3A only exemplarily illustrates that the gating signal terminal Gate is electrically connected to G1. In some embodiments, the first reset terminal Gate1 may be connected to G1, or the second reset terminal Gate2 may be electrically connected to G1. In some embodiments, an output terminal Output of each GOA register is electrically connected to gating signal terminals Gate in a same row of pixel circuits 30.

A process of how the pixel circuit 30 shown in FIG. 3A drives the light-emitting device L to emit light will be described below with reference to the timing signals shown in FIG. 3B. For the convenience of description, following embodiments will be described in an example where transistors constituting the pixel circuit 30 are N-type transistors. In a case where a transistor is an N-type transistor, the transistor is turned on under a control of a high level signal, and the transistor is turned off under a control of a low level signal. The high level signal is relative to the low level signal. For example, when the high level signal is +5 V, the low level signal may be 0 V. For example, when the high level signal is 0 V, the low level signal may be −5 V.

Figure 3B:
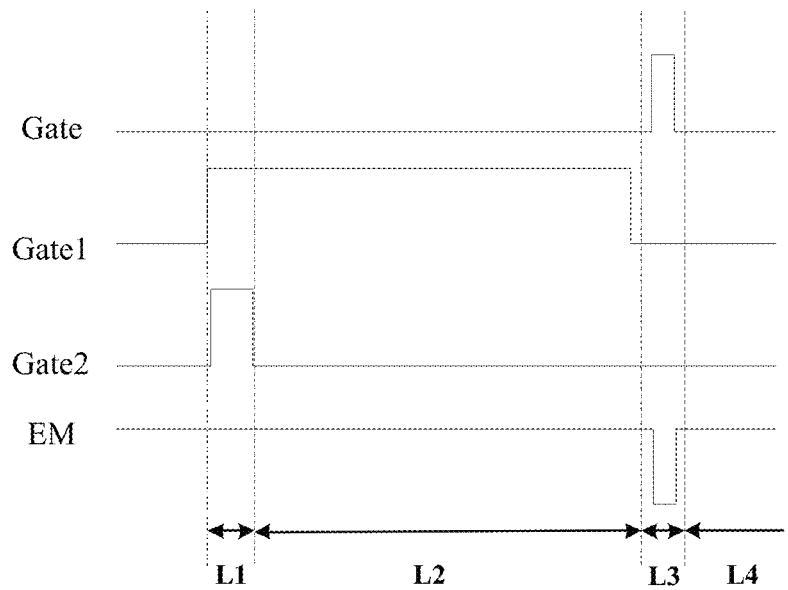
FIG. 3B is a timing diagram of the pixel circuit shown in FIG. 3A.

As shown in FIG. 3B, the process of driving the light-emitting device L to emit light by the pixel circuit 30 may include a reset phase L1, a compensation phase L2, a data writing phase L3 and a light-emitting phase L4.

In the reset phase L1, the first reset terminal Gate1 and the second reset terminal Gate2 each output a high level signal. In this case, reset transistors M2 and M4 in FIG. 3A are turned on. When the reset transistor M2 is turned on, a second reset signal VIN2 is transmitted to a gate g of a driving transistor M3 to initially reset the gate g of the driving transistor M3. In addition, when the reset transistor M4 is turned on, a first reset signal VIN1 is transmitted to an anode of an OLED device to initially reset the anode of the OLED device. Through the above reset processes, influences of electrical signals remained in a previous frame on the gate g of the driving transistor M3 and the anode of the OLED device may be eliminated.

In the compensation phase L2, the first reset terminal Gate1 continuously inputs a high level signal to compensate for a threshold voltage Vth of the driving transistor M3. In the data writing phase L3, the light-emitting control terminal EM inputs a low level signal, a light-emitting transistor M5 is turned off. The gating signal terminal Gate inputs a high level gating signal. In this case, a data writing transistor M1 is turned on, so that the data signal Vdata is written into the driving transistor M3 through the data signal terminal Data. In the light-emitting phase L4, the light-emitting control terminal EM inputs a high level light-emitting signal. In this case, a light-emitting control transistor M5 is turned on, and a current path is formed between VDD (voltage drain drain) and VSS (voltage source source), so that a driving current generated by the driving transistor M3 is able to flow into the light-emitting device L to drive the light-emitting device to emit light.

It will be noted that a circuit terminal, a corresponding signal line and a signal transmitted by the signal line may be explained by using a same reference numeral for simplicity. For example, the light-emitting control terminal, the light-emitting signal and the light-emitting control signal line are all represented by "EM". Similar situation(s) will not be repeated below.

In addition, in a case where the light-emitting device L is the OLED, since the OLED is a current light-emitting device, a magnitude of a driving current flowing through the OLED may be controlled by controlling a magnitude of the data signal Vdata, so as to control the light-emitting brightness of the OLED.

In summary, the pixel circuit 30 may drive the light-emitting device L to emit light under the combined action of the light-emitting signal, the gating signal Vgate and the data signal Vdata.

Figure 4:
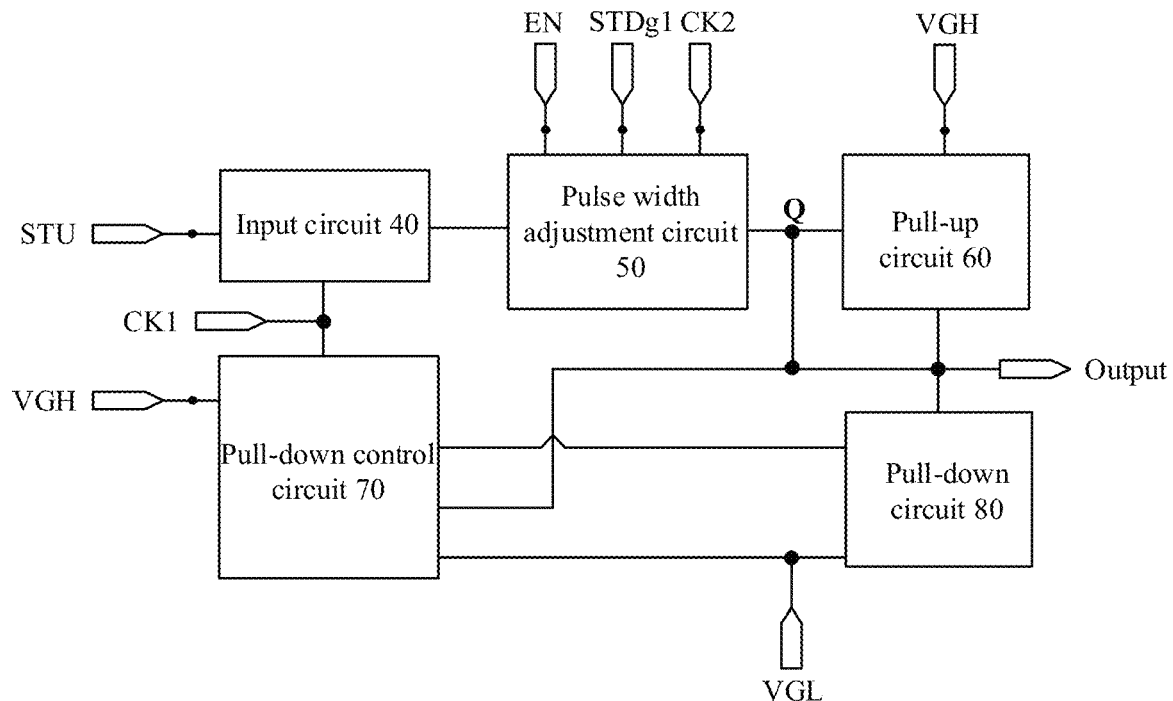
FIG. 4 is a circuit block diagram of a light-emitting control shift register, in accordance with some embodiments.

In order to supply the light-emitting signals to the pixel circuits 30, in some embodiments of the present disclosure, as shown in FIG. 4, a circuit block diagram of an EOA register is provided. The EOA register may include an input circuit 40, a pulse width adjustment circuit 50, a pull-up circuit 60, a pull-down control circuit 70 and a pull-down circuit 80.

The input circuit 40 is electrically connected to the first signal input terminal STU and the first clock signal terminal CK1. The input circuit 40 is configured to output a signal of the first signal input terminal STU under a control of a signal from the first clock signal terminal CK1.

The pulse width adjustment circuit 50 is electrically connected to the input circuit 40, the enable signal terminal EN, the second signal input terminal STDg1, the second clock signal terminal CK2 and a pull-up node Q. The pulse width adjustment circuit 50 is configured to transmit the signal output from the input circuit 40 to the pull-up node Q under a control of a signal from the enable signal terminal EN. The pulse width adjustment circuit 50 is further configured to output a signal of the second clock signal terminal CK2 to the pull-up node Q under a control of a signal from the second signal input terminal STDg1.

The pull-up circuit 60 is electrically connected to the pull-up node Q, the first voltage terminal VGH and the signal output terminal Output. The pull-up circuit 60 is configured to output a voltage of the first voltage terminal VGH to the signal output terminal Output under a control of the pull-up node Q.

The pull-down control circuit 70 is electrically connected to the first clock signal terminal CK1, the first voltage terminal VGH, the pull-up node Q and the second voltage terminal VGL. The pull-down control circuit 70 is configured to output the voltage of the first voltage terminal VGH under a control of signals from the pull-up node Q, the first clock signal terminal CK1 and the first voltage terminal VGH. The pull-down control circuit 70 is further configured to output a voltage of the second voltage terminal VGL under the control of the pull-up node Q.

The pull-down circuit 80 is electrically connected to the pull-down control circuit 70, the signal output terminal Output and the second voltage terminal VGL. The pull-down circuit 80 is configured to pull down a voltage of the signal output terminal Output to the voltage of the second voltage terminal VGL under a control of an output signal from the pull-down control circuit 70.

It will be noted that the signal of the first signal input terminal STU may be a signal output from a signal output terminal Output of a previous stage EOA register. Alternatively, the signal of the first signal input terminal STU may be the first start signal GSTV1 output from the first start signal terminal GSTV1, and in this case, the EOA register is E1. A description will be made in the embodiments of the present disclosure in an example where the first voltage terminal VGH outputs a constant high level signal, and the second voltage terminal VGL outputs a constant low level signal.

It can be seen from the above that each EOA register outputs the light-emitting signal from the signal output terminal Output under a combined action of the input circuit 40, the pulse width adjustment circuit 50, the pull-up circuit 60, the pull-down control circuit 70 and the pull-down circuit 80, and transmits the light-emitting signal to the light-emitting control terminal EM of the pixel circuit 30 through the light-emitting control signal line EM (as shown in FIG. 3A). In this case, the light-emitting signal may be the high level signal output from the first voltage terminal VGH or the low level signal output from the second voltage terminal VGL. Due to an action of the light-emitting signal, the pixel circuit 30 outputs the driving current to the light-emitting device L electrically connected to the pixel circuit 30, so as to drive the light-emitting device L to emit light.

Next, specific structures of the input circuit 40, the pulse width adjustment circuit 50, the pull-up circuit 60, the pull-down control circuit 70 and the pull-down circuit 80 will be described in detail.

Figure 5:
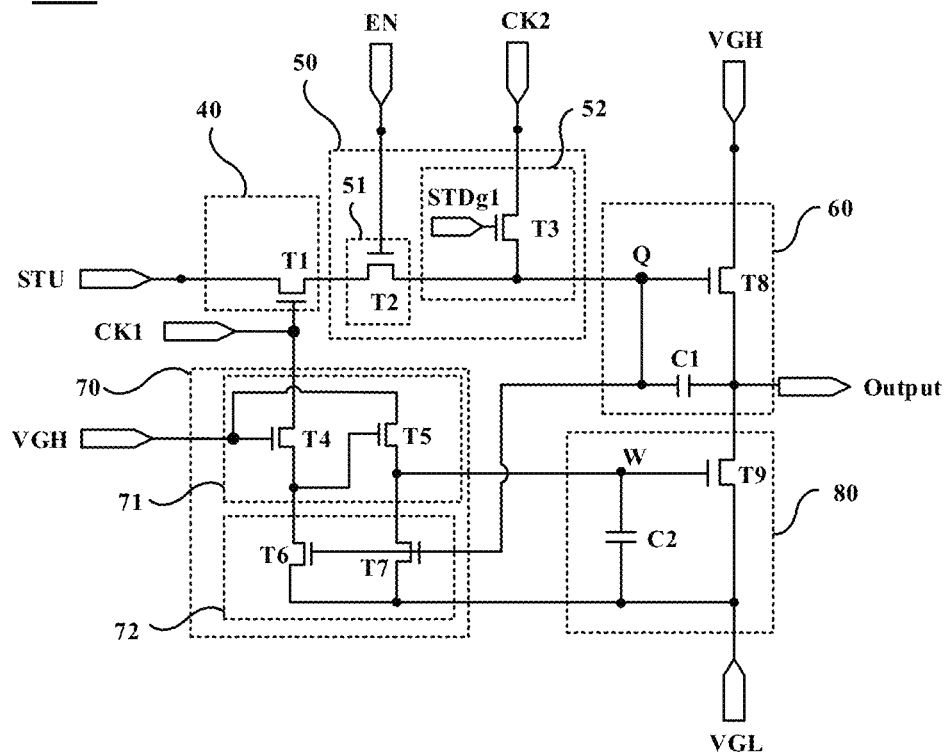
FIG. 5 is a specific circuit diagram of the light-emitting control shift register shown in FIG. 4.

In some embodiments of the present disclosure, as shown in FIG. 5, the input circuit 40 may include a first transistor T1. A first electrode of the first transistor T1 is electrically connected to the first signal input terminal STU, and a gate of the first transistor T1 is electrically connected to the first clock signal terminal CK1.

In some embodiments of the present disclosure, as shown in FIG. 5, the pulse width adjustment circuit 50 may include a first pulse width adjustment sub-circuit 51 and a second pulse width adjustment sub-circuit 52.

The first pulse width adjustment sub-circuit 51 is electrically connected to the input circuit 40, the enable signal terminal EN and the pull-up node Q. The first pulse width adjustment sub-circuit 51 is configured to transmit the signal output from the input circuit 40 to the pull-up node Q under the control of the signal from the enable signal terminal EN. For example, as shown in FIG. 5, the first pulse width adjustment sub-circuit 51 may include a second transistor T2. A first electrode of the second transistor T2 is electrically connected to a second electrode of the first transistor T1, a second electrode of the second transistor T2 is electrically connected to the pull-up node Q, and a gate of the second transistor T2 is electrically connected to the enable signal terminal EN.

The second pulse width adjustment sub-circuit 52 is electrically connected to the second signal input terminal STDg1, the second clock signal terminal CK2 and the pull-up node Q. The second pulse width adjustment sub-circuit 52 is configured to output the signal of the second clock signal terminal CK2 to the pull-up node Q under the control of the signal from the second signal input terminal STDg1. For example, as shown in FIG. 5, the second pulse width adjustment sub-circuit 52 may include a third transistor T3. A first electrode of the third transistor T3 is electrically connected to the second clock signal terminal CK2, a second electrode of the third transistor T3 is electrically connected to the pull-up node Q, and a gate of the third transistor T3 is electrically connected to the second signal input terminal STDg1.

In some embodiments of the present disclosure, as shown in FIG. 5, the pull-down control circuit 70 may include a first pull-down control sub-circuit 71 and a second pull-down control sub-circuit 72.

The first pull-down control sub-circuit 71 is electrically connected to the first clock signal terminal CK1, the first voltage terminal VGH and the second pull-down control sub-circuit 72. The first pull-down control sub-circuit 71 is configured to output the voltage of the first voltage terminal VGH under the control of the signals from the first clock signal terminal CK1 and the first voltage terminal VGH when the second pull-down control sub-circuit is turned off. For example, as shown in FIG. 5, the first pull-down control sub-circuit 71 may include a fourth transistor T4 and a fifth transistor T5. A first electrode of the fourth transistor T4 is electrically connected to the first clock signal terminal CK1, and a gate of the fourth transistor T4 is electrically connected to the first voltage terminal VGH. A first electrode of the fifth transistor T5 is electrically connected to the first voltage terminal VGH, and a gate of the fifth transistor T5 is electrically connected to a second electrode of the fourth transistor T4.

The second pull-down control sub-circuit 72 is further electrically connected to the pull-up node Q and the second voltage terminal VGL. The second pull-down control sub-circuit 72 is configured to be turned off under the control of the signal from the pull-up node, and output the voltage of the second voltage terminal VGL under the control of the pull-up node Q. For example, as shown in FIG. 5, the second pull-down control sub-circuit 72 may include a sixth transistor T6 and a seventh transistor T7. A first electrode of the sixth transistor T6 is electrically connected to the second electrode of the fourth transistor T4, a second electrode of the sixth transistor T6 is electrically connected to the second voltage terminal VGL, and a gate of the sixth transistor T6 is electrically connected to the pull-up node Q. A first electrode of the seventh transistor T7 is electrically connected to a second electrode of the fifth transistor T5, a second electrode of the seventh transistor T7 is electrically connected to the second voltage terminal VGL, and a gate of the seventh transistor T7 is electrically connected to the pull-up node Q.

In some embodiments of the present disclosure, as shown in FIG. 5, the pull-up circuit 60 may include an eighth transistor T8 and a first capacitor C1. A first electrode of the eighth transistor T8 is electrically connected to the first voltage terminal VGH, a second electrode of the eighth transistor T8 is electrically connected to the signal output terminal Output, and a gate of the eighth transistor T8 is electrically connected to the pull-up node Q. A first electrode of the first capacitor C1 is electrically connected to the pull-up node Q, and a second electrode of the first capacitor C1 is electrically connected to the signal output terminal Output.

In some embodiments of the present disclosure, as shown in FIG. 5, the pull-down circuit 80 may include a ninth transistor T9 and a second capacitor C2. A first electrode of the ninth transistor T9 is electrically connected to the second voltage terminal VGL, a second electrode of the ninth transistor T9 is electrically connected to the signal output terminal Output, and a gate of the ninth transistor T9 is electrically connected to the second electrode of the fifth transistor T5. A first electrode of the second capacitor C2 is electrically connected to the gate of the ninth transistor T9, and a second electrode of the second capacitor C2 is electrically connected to the second voltage terminal VGL.

Figure 6:
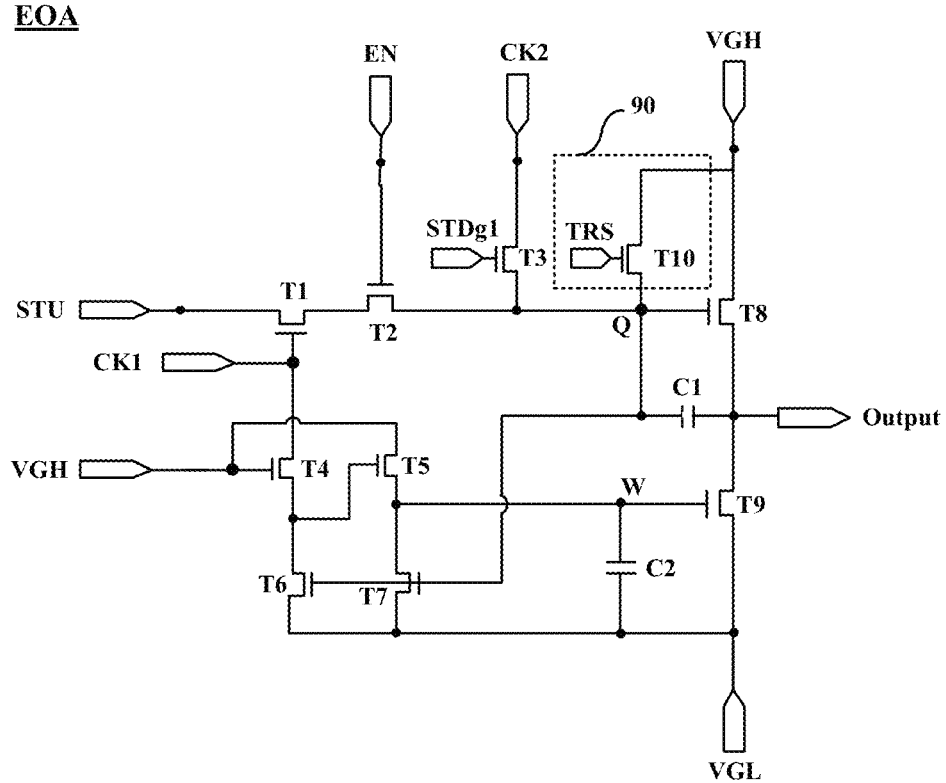
FIG. 6 is a circuit diagram of a light-emitting control shift register, in accordance with some other embodiments.

In some embodiments of the present disclosure, in order to improve the noise reduction effect, as shown in FIG. 6, the EOA register may further include a pull-up control circuit 90. The pull-up control circuit 90 is electrically connected to the first voltage terminal VGH, the pull-up node Q and a pull-up control signal terminal TRS. The pull-up control circuit 90 is configured to output the voltage of the first voltage terminal VGH to the pull-up node Q under a control of a signal from the pull-up control signal terminal TRS. The pull-up control signal terminal TRS may continuously input a high level signal.

In this way, the signal output terminal Output of the EOA register may be directly controlled to output the high level signal of the first voltage terminal VGH by using the pull-up control circuit 90, so that a false output is avoided, thereby improving a reliability of an output result, so as to improve the noise reduction effect.

In some embodiments of the present disclosure, as shown in FIG. 6, the pull-up control circuit 90 may include a tenth transistor T10. A first electrode of the tenth transistor T10 is electrically connected to the first voltage terminal VGH, a second electrode of the tenth transistor T10 is electrically connected to the pull-up node Q, and a gate of the tenth transistor is electrically connected to the pull-up control signal terminal TRS.

In summary, the EOA register circuits provided in the embodiments of the present disclosure may supply the light-emitting signals to the pixel circuits 30 in the sub-pixels P arranged in the array, so that due to the action of the light-emitting signal, the pixel circuit 30 outputs the driving current to the light-emitting device L electrically connected to the pixel circuit 30, so as to drive the light-emitting device L to emit light. In addition, the EOA register circuit includes the pull-up control circuit 90, which may improve the reliability of the output result, so as to improve the noise reduction effect.

It will be noted that the transistors used in the EOA register provided in the embodiments of the present disclosure may be thin film transistors TFT, field effect transistors (e.g., metal-oxide semiconductor, MOS) or other switching transistors with same characteristics, which is not limited in the embodiments of the present disclosure.

In addition, the TFTs may be manufactured by using a-Si process, an oxide semiconductor process, a low temperature poly-silicon (LTPS) process, or a high temperature poly-silicon (HTPS) process, which is not limited in the embodiments of the present disclosure.

A type of the above transistor is not limited in the embodiments of the present disclosure. The transistor may be an N-type transistor, a P-type transistor, an enhancement transistor, or a depletion transistor. In the embodiments of the present disclosure, in order to distinguish two electrodes of a transistor except a gate, one of the two electrodes is directly described as a first electrode, and another electrode of the two electrodes is a second electrode. In this case, the first electrode of the transistor may be one of a source (S) and a drain (D) of the transistor, and the second electrode may be another one of the source S and the drain D of the transistor. Since the source and the drain of the transistor may be symmetrical in structure, the source and the drain of the transistor may be the same in structure.

In addition, in the embodiments of the present disclosure, the capacitors (e.g., the first capacitor C1 and the second capacitor C2 in FIG. 5) each may be a capacitor device separately manufactured by a process. For example, the capacitor device is realized by manufacturing special capacitor electrodes, and the capacitor electrodes of the capacitor each may be realized by a metal layer or a semiconductor layer (e.g., doped with poly-silicon). Alternatively, the capacitor may be realized by a parasitic capacitance between transistors, or by a parasitic capacitance between the transistor itself and other device or wiring, or by a parasitic capacitance between wirings of the circuit itself. In addition, it will be noted that each transistor described above may further include at least one switching transistor connected in parallel therewith. The pixel circuit is merely exemplarily described above, and other structures with the same functions as the pixel circuit are not repeated here, but all shall be included in the protection scope of the present disclosure.

Figure 7A:
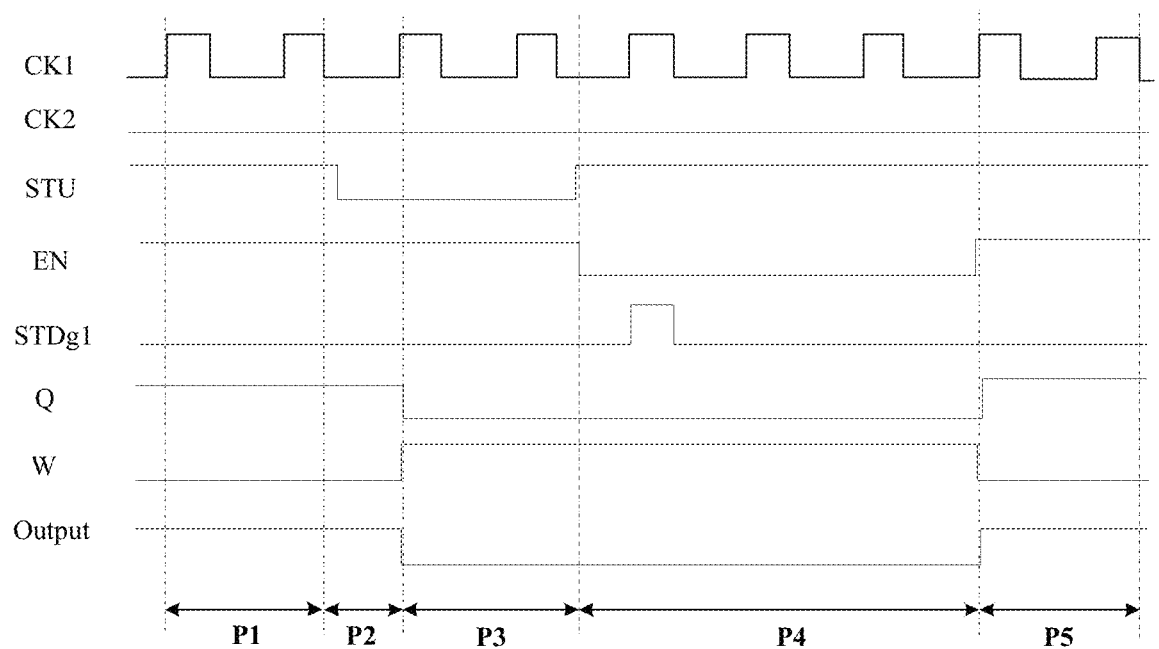
FIG. 7A is a timing diagram corresponding to the light-emitting control shift register shown in FIG. 5.
Figure 7B:
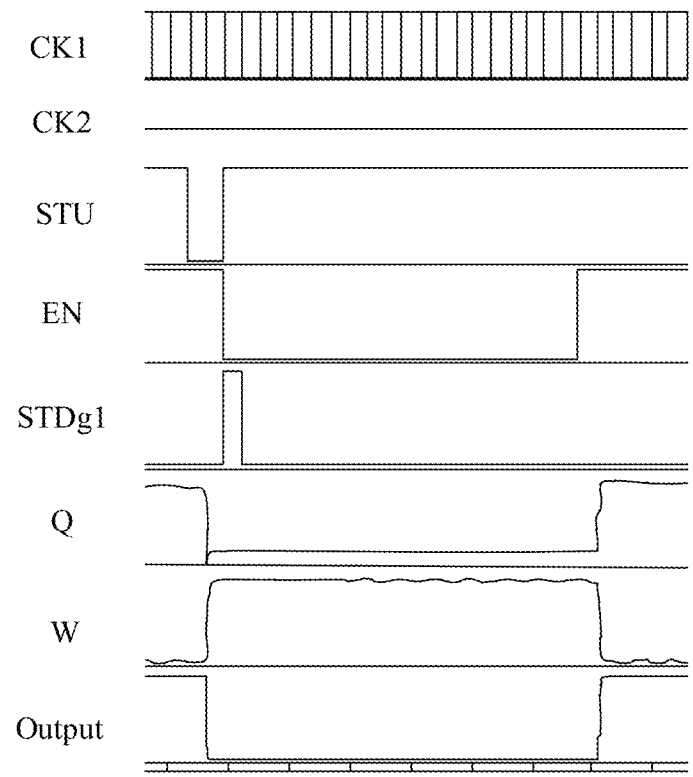
FIG. 7B is a simulation effect diagram of the light-emitting control shift register shown in FIG. 5 according to the timing diagram shown in FIG. 7A.

For the convenience of description, following embodiments will be described by taking the EOA register circuit shown in FIG. 5 as an example. In some embodiments of the present disclosure, for the EOA register circuit shown in FIG. 5, a timing waveform diagram as shown in FIG. 7A is provided. In order to verify the technical effect of the EOA register circuit shown in FIG. 5 in combination with the timing signals shown in FIG. 7A, a simulation experiment is performed. An experimental verification result is shown in FIG. 7B, and signal waveforms of the pull-up node Q and a node W in the EOA register circuit and an output result of the signal output terminal Output are obtained, which indicates that the EOA register circuit shown in FIG. 5 provided in the embodiments of the present disclosure may output an effective and correct signal waveform in combination with the timing signals shown in FIG. 7A.

Hereinafter, in an example where the above transistors are all N-type transistors (without considering influences of threshold voltages of the transistors), how each transistor in the EOA register circuit shown in FIG. 5 is turned on or off in different phases (i.e., P1 to P5) of an image frame will be exemplarily described in detail in combination with the timing signals shown in FIG. 7A.

In the first charging phase P1, STU=1, CK1=1, CK2=0, EN=1, STDg1=0, and Output=1. Here, "0" represents a low level signal, and "1" represents a high level signal.

In this case, the input circuit 40 outputs the signal of the first signal input terminal STU under a control of a high level signal from the first clock signal terminal CK1. The pulse width adjustment circuit 50 transmits the signal output from the input circuit 40 to the pull-up node Q under the control of the signal from the enable signal terminal EN. The pull-up circuit 60 outputs the voltage of the first voltage terminal VGH to the signal output terminal Output under the control of the pull-up node Q.

Figure 8:
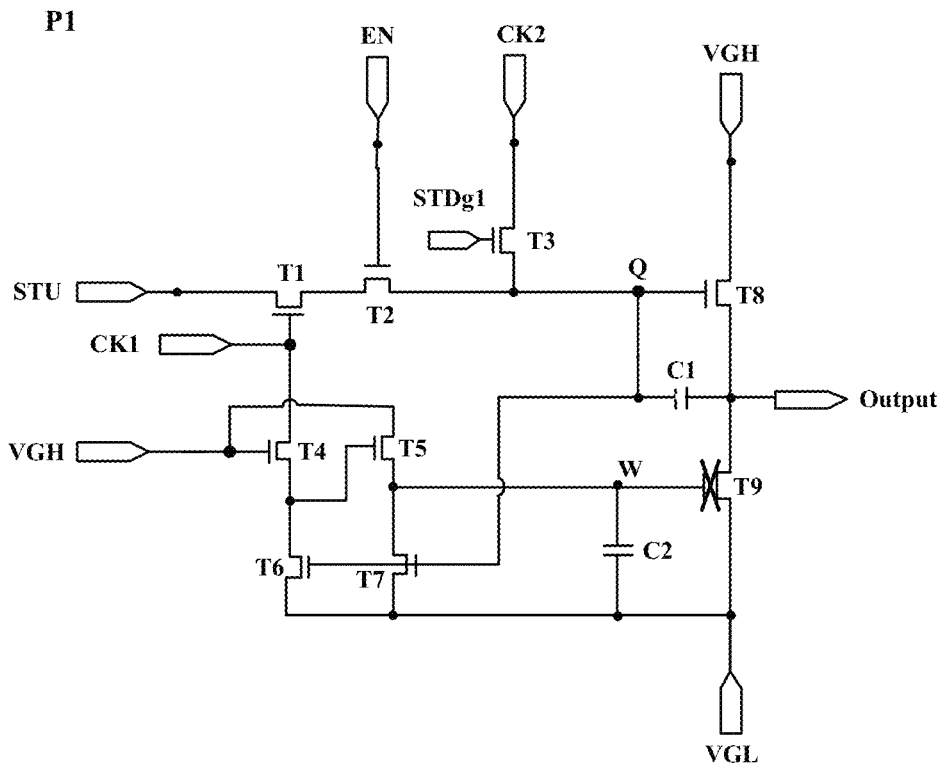
FIG. 8 is an equivalent circuit diagram of the light-emitting control shift register shown in FIG. 5 in a first charging phase.

As shown in FIG. 8, the first clock signal terminal CK1 and the enable signal terminal EN each output a high level signal, so that the first transistor T1 and the second transistor T2 are turned on to output a high level signal of the first signal input terminal STU to the pull-up node Q, so as to charge the pull-up node Q. Thus, a potential of the pull-up node Q is increased.

It will be noted that in the first charging phase P1, the first clock signal terminal CK1 needs to output only the high level signal, so that the first transistor T1 may be turned on to output the high level signal of the first signal input terminal STU to the pull-up node Q. Even in the first charging phase P1, the first clock signal terminal CK1 also outputs a low level signal, so that the first transistor T1 is turned off. However, in this case, the EOA register circuit has no discharge path, and therefore, the pull-up node Q may still be maintained at a high potential.

The first capacitor C1 stores the high level signal input to the pull-up node Q. In addition, as the potential of the pull-up node Q is gradually increased, the eighth transistor T8 is turned on, so that the high level signal output from the first voltage terminal VGH is transmitted to the signal output terminal Output.

In addition, the sixth transistor T6 and the seventh transistor T7 are turned on under a control of the high level signal at the pull-up node Q. Therefore, even if the high level signal output from the first voltage terminal VGH enables the fourth transistor T4 to be turned on, and thus the fifth transistor T5 is turned on, the sixth transistor T6 and the seventh transistor T7 that are turned-on may cause the second electrode of the fourth transistor T4 and the second electrode of the fifth transistor T5 to be pulled down, so that the signal on the second electrode of the fourth transistor T4 and the signal on the second electrode of the fifth transistor T5 are each the low level signal output from the second voltage terminal VGL. In this case, the low level signal is input to the node W. Under a control of the low level signal at the node W, the ninth transistor T9 is in an off state.

It can be seen from the above that in the first charging phase P1, the signal output terminal Output of the EOA register outputs the high level signal from the first voltage terminal VGH, and after this high level signal is transmitted to the light-emitting control terminal EM of the pixel circuit 30, the pixel circuit 30 may be in the reset phase L1 or the compensation phase L2 or the light-emitting phase L4 as shown in FIG. 3B.

In the charging hold phase P2, STU=0, CK1=0, CK2=0, EN=1, STDg1=0, and Output=1.

In this case, the pull-up circuit 60 keeps outputting the voltage of the first voltage terminal VGH to the signal output terminal Output under a control of the pull-up node Q.

Figure 9:
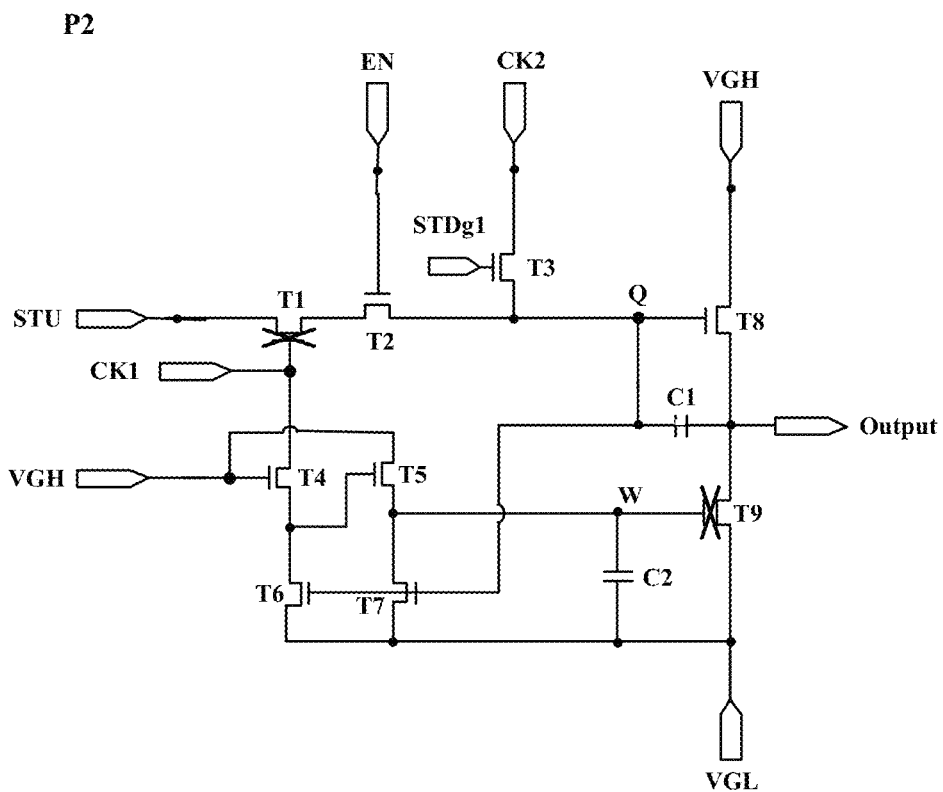
FIG. 9 is an equivalent circuit diagram of the light-emitting control shift register shown in FIG. 5 in a charging hold phase.

As shown in FIG. 9, the first clock signal terminal CK1 outputs a low level signal, so that the first transistor T1 is turned off. In this case, the EOA register circuit has no discharge path, and therefore, the pull-up node Q may still be maintained at the high potential. Under a control of the high potential of the pull-up node Q, the signal output terminal Output still outputs the voltage of the first voltage terminal VGH. The node W is still at a low potential, so that the ninth transistor T9 is in the off state.

It can be seen from the above that in the charging hold phase P2, the signal output terminal Output still outputs the high level signal from the first voltage terminal VGH, and after this high level signal is transmitted to the light-emitting control terminal EM of the pixel circuit 30, the pixel circuit 30 may be in the reset phase L1 or the compensation phase L2 or the light-emitting phase L4 as shown in FIG. 3B.

In the discharging phase P3, STU=0, CK1=1, CK2=0, EN=1, STDg1=0, and Output=0.

In this case, the input circuit 40 outputs the signal of the first signal input terminal STU under the control of the signal from the first clock signal terminal CK1. The pulse width adjustment circuit 50 transmits the signal output from the input circuit 40 to the pull-up node Q under the control of the signal from the enable signal terminal EN. The pull-down control circuit 70 outputs the voltage of the first voltage terminal VGH under the control of the signals from the pull-up node Q, the first clock signal terminal CK1 and the first voltage terminal VGH. The pull-down circuit 80 pulls down the voltage of the signal output terminal Output to the voltage of the second voltage terminal VGL under a control of the voltage from the first voltage terminal VGH.

Figure 10:
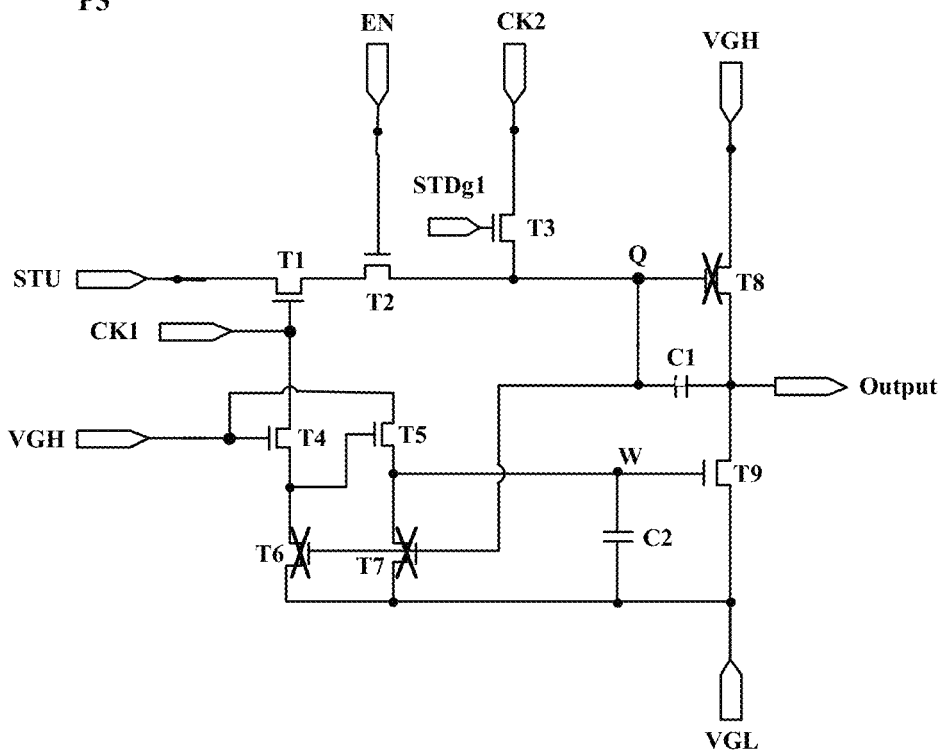
FIG. 10 is an equivalent circuit diagram of the light-emitting control shift register shown in FIG. 5 in a discharging phase.

As shown in FIG. 10, the first clock signal terminal CK1 and the enable signal terminal EN each output a high level signal, so that the first transistor T1 and the second transistor T2 are turned on to output a low level signal of the first signal input terminal STU to the pull-up node Q, so as to discharge the pull-up node Q. Thus, the potential of the pull-up node Q is reduced.

It will be noted that in the discharging phase P3, the first clock signal terminal CK1 needs to output only the high level signal, so that the first transistor T1 may be turned on to output the low level signal of the first signal input terminal STU to the pull-up node Q. Even in the discharging phase P3, the first clock signal terminal CK1 also outputs a low level signal, so that the first transistor T1 is turned off. However, in this case, the EOA register circuit has no discharge path, and therefore, the pull-up node Q may still be maintained at a low potential.

Under a control of the low level signal at the pull-up node Q, the sixth transistor T6, the seventh transistor T7 and the eighth transistor T8 are turned off. Under a control of the high level signal output from the first voltage terminal VGH, the fourth transistor T4 is turned on, and thus the fifth transistor T5 is turned on, so that the second electrode of the fifth transistor T5 outputs the high level signal from the first voltage terminal VGH. Thus, the potential of the node W is gradually increased, so that the ninth transistor T9 is turned on. Under a control of the high level signal at the node W, the voltage of the signal output terminal Output is pulled down to the voltage of the second voltage terminal VGL.

It can be seen from the above that in the discharging phase P3, the signal output terminal Output of the EOA register outputs the low level signal from the second voltage terminal VGL, and after this low level signal is transmitted to the light-emitting control terminal EM of the pixel circuit 30, the pixel circuit 30 may be in the data writing phase L3 as shown in FIG. 3B. In this case, the OLED light-emitting device does not emit light.

In the pulse width adjustment phase P4, STU=1, CK2=0, EN=0, and Output=0.

In this case, the pulse width adjustment circuit 50 transmits the signal output from the input circuit 40 to the pull-up node Q under the control of the signal from the enable signal terminal EN.

Figure 11:
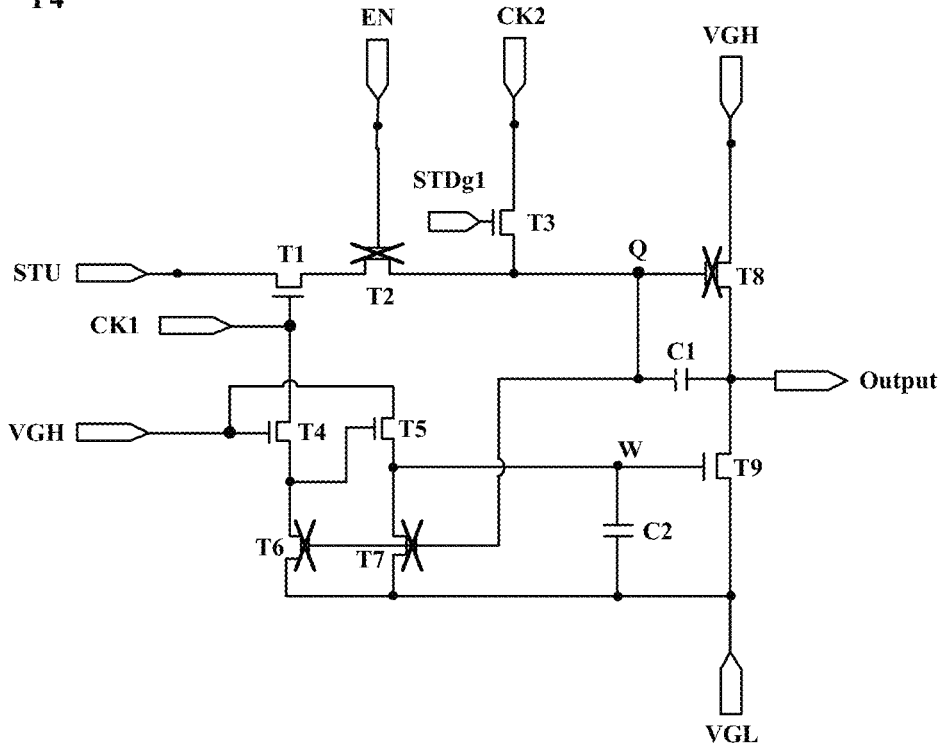
FIG. 11 is an equivalent circuit diagram of the light-emitting control shift register shown in FIG. 5 in a pulse width adjustment phase.

As shown in FIG. 11, the enable signal terminal EN outputs a low level signal, so that the second transistor T2 is turned off. In this case, the pull-up node Q is maintained at the low level signal in the previous phase. Similarly, under the control of the low level signal at the pull-up node Q, the sixth transistor T6, the seventh transistor T7 and the eighth transistor T8 are turned off. The node W is maintained at the high potential. Under the control of the node W, the signal output terminal Output keeps outputting the low level signal from the second voltage terminal VGL.

It will be noted that the second clock signal terminal CK2 always outputs a low level signal, so that whether the second signal input terminal STDg1 outputs a high level signal or a low level signal, the pull-up node Q and the output signal of the signal output terminal Output are not affected.

It can be seen from the above that in the pulse width adjustment phase P4, the signal output terminal Output of the EOA register keeps outputting the low level signal, and after this low level signal is transmitted to the light-emitting control terminal EM of the pixel circuit 30, the pixel circuit 30 may be in the data writing phase L3 as shown in FIG. 3B. In this case, the OLED light-emitting device does not emit light.

In the second charging phase P5, STU=1, CK2=0, EN=1, STDg1=0, and Output=1.

In this case, the input circuit 40 outputs the signal of the first signal input terminal STU under the control of the signal from the first clock signal terminal CK1. The pulse width adjustment circuit 50 transmits the signal output from the input circuit 40 to the pull-up node Q under the control of the signal from the enable signal terminal EN. The pull-up circuit 60 outputs the voltage of the first voltage terminal VGH to the signal output terminal Output under the control of the pull-up node Q.

In the second charging phase P5, the signal output terminal Output outputs the high level signal from the first voltage terminal VGH. A description of the second charging phase P5 is similar to the description of the first charging phase P1, and will not be repeated here.

A difference is that in the second charging phase P5, after the high level signal output from the signal output terminal Output of the EOA register is transmitted to the light-emitting control terminal EM of the pixel circuit 30, the pixel circuit 30 is in the light-emitting phase L4 as shown in FIG. 3B. In this case, the OLED light-emitting device emits light.

It will be noted that FIG. 7A merely exemplarily illustrates the waveforms of the second charging phase P5, and the embodiments of the present disclosure are not limited thereto. Other waveforms of the second charging phase P5 are similar to those shown in FIG. 7A. In addition, a level signal output from a signal output terminal Output of a previous stage EOA register is input to the first signal input terminal STU. A level signal output from an output terminal Output of a next stage GOA register is input to the second signal input terminal STDg1.

In addition, in the embodiments of the present disclosure, the N-type transistors are taken as an example, and an N-type transistor is turned on due to a high level signal, and is turned off due to a low level signal. Therefore, in the embodiments of the present disclosure, a low level signal is referred to as a non-effective signal, and a duration of outputting the low level signal is referred to as a non-effective duration; a high level signal is referred to as an effective signal, and a duration of outputting the high level signal is referred to as an effective duration.

Through the above timing control process, it can be found that in an image frame, a non-effective duration of the light-emitting signal output from the signal output terminal Output of the EOA register (i.e., a duration of outputting a low level signal by the signal output terminal Output) is greater than a duration of outputting a low level signal by the first signal input terminal STU (as shown in FIG. 7A). Moreover, the level signal output from the signal output terminal Output of the previous stage EOA register is input to the first signal input terminal STU. Thus, a non-effective duration of a light-emitting signal output from a current EOA register is greater than a non-effective duration of a light-emitting signal output from a previous stage EOA register. The non-effective duration of the light-emitting signal output from the current EOA register may be controlled by a non-effective duration of the enable signal transmitted by the enable signal terminal EN (i.e., a duration of outputting a low level signal by the enable signal terminal EN). The longer the non-effective duration of the enable signal, the longer the non-effective duration of the light-emitting signal.

Figure 12:
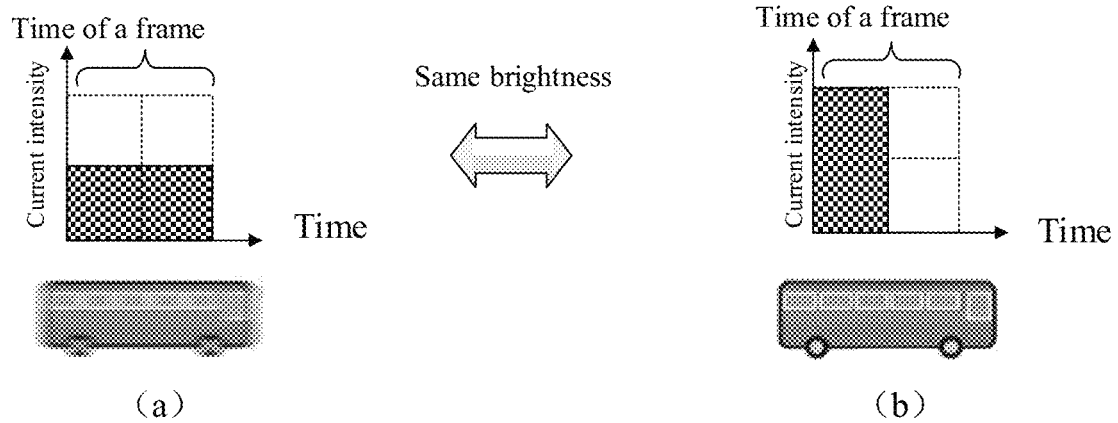
FIG. 12 is a diagram showing relationships of a dynamic afterimage, a light-emitting duration and a current intensity.

Moreover, as shown in (a) of FIG. 12, in a frame of image, when the display apparatus 100 displays a moving picture, if the sub-pixel P has a long light-emitting duration and a small light-emitting brightness, it can be seen that the displayed picture is blurred although the sub-pixel P has a long lifetime in this case. However, as shown in (b) of FIG. 12, in a case where the sub-pixel P has a short light-emitting duration and a large light-emitting brightness, it can be seen that the displayed picture is clear, but the sub-pixel P has a short lifetime in this case. Therefore, in order to prolong a service life of a product, and to reduce moving picture response time (MPRT) and an occurrence probability of a dynamic afterimage, in an image frame, it is necessary to supply a light-emitting signal with a short effective duration (or a light-emitting signal with a long non-effective duration) and a large data signal Vdata to the sub-pixel P when the display apparatus 100 displays a moving picture; it is necessary to supply a light-emitting signal with a long effective duration (or a light-emitting signal with a short non-effective duration) and a small data signal Vdata to the sub-pixel P when the display apparatus 100 displays a static picture. In this way, the requirement for a long service life of the display apparatus 100 is met, and the requirement for smooth display of a moving picture on the display apparatus 100 may be met.

It can be seen from the above analysis that the non-effective duration of the light-emitting signal output from the current EOA register may be greater than the non-effective duration of the light-emitting signal output from the previous stage EOA register by using the EOA register circuit shown in FIG. 5 in combination with the timing waveforms shown in FIG. 7A. In this case, the light-emitting signal output from the current EOA register may serve as a light-emitting signal required for displaying a moving picture, and the light-emitting signal output from the previous stage EOA register may serve as a light-emitting signal required for displaying a static picture.

In this way, in an image frame, by using the EOA register circuit shown in FIG. 5 and the timing waveforms shown in FIG. 7A, the light-emitting signals with required non-effective durations are supplied to the sub-pixels P of the static picture, and the light-emitting signals with required non-effective durations are supplied to the sub-pixels P of the moving picture, so that the MPRT is reduced, the occurrence probability the dynamic afterimage is reduced, and the service life of the product is prolonged.

Figure 13:
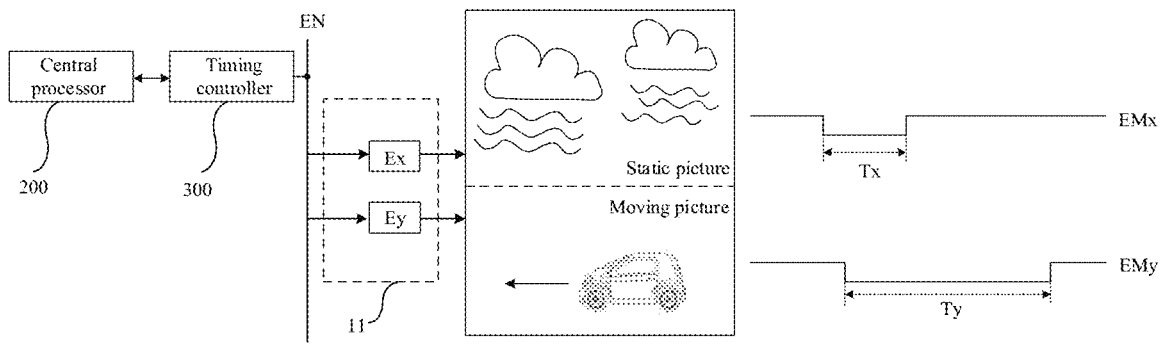
FIG. 13 is a diagram showing display pictures on a display apparatus, in accordance with some embodiments.

Based on the same inventive concept, some embodiments of the present disclosure provide a method for controlling the display apparatus 100. In some embodiments of the present disclosure, as shown in FIG. 13, the display apparatus 100 may further include a central processor (also referred to as central processing unit, CPU) 200 and a timing controller 300 (also referred to as time sequence controller, T-Com). The central processor 200 may acquire moving picture data and static picture data of an image to be displayed.

Firstly, the central processor 200 receives information transmitted by decoders, and then obtains display information such as brightness and chromaticity of a current frame picture. Then, the central processor 200 compares the obtained brightness and chromaticity information of the current frame picture with brightness and chromaticity information of a previous frame picture in a double data rate synchronous dynamic random memory (DDR) according to a set algorithm. If a brightness and chromaticity of part of the current frame picture are unchanged compared with a brightness and chromaticity of a corresponding part of the previous frame picture, it indicates that data of this part of the current frame picture is the static picture data. That is, each row of pixel circuits 30 corresponding to this part of the picture receives static picture data in this case. If a brightness and chromaticity of part of the current frame picture are changed compared with a brightness and chromaticity of a corresponding part of the previous frame picture, it indicates that data of this part of the current frame picture is the moving picture data. That is, each row of pixel circuits 30 corresponding to this part of the picture receives moving picture data in this case.

After the central processor 200 determines that display data received by each row of pixel circuits 30 is the moving picture data or the static picture data, the timing controller 300 electrically connected to the central processor 200 may supply corresponding input signals, an enable signal and a clock control signal to a corresponding EOA register according to the static picture data and the moving picture data.

As shown in FIG. 13, the first gate driving circuit 11 in the display apparatus 100 may include a first EOA register Ex and a second EOA register Ey. A first signal input terminal STU of the second EOA register Ey is electrically connected to a signal output terminal Output of the first EOA register Ex. A same row of pixel circuits 30 electrically connected to the second EOA register Ey is referred to as a currently scanned row of pixel circuits 30, and in this case, a same row of pixel circuits 30 electrically connected to the first EOA register Ex is referred to as a previously scanned row of pixel circuits 30.

Hereinafter, the method for controlling the display apparatus 100 will be exemplarily described. The control method includes the above method for controlling the EOA register (such as the timing waveforms in FIG. 7A). In the pulse width adjustment phase P4 in the above method for controlling the EOA register, before controlling each EOA register, the method for controlling the display apparatus 100 further includes following steps.

The central processor 200 determines that the display data received by each row of pixel circuits is the moving picture data or the static picture data. The specific determination method is as described above, and will not be repeated here.

When display data received by the currently scanned row of pixel circuits 30 is converted from static picture data to moving picture data, the timing controller 300 adjusts a pulse width of an enable signal supplied to an EOA register electrically connected to the currently scanned row of pixel circuits 30, so that a non-effective duration of the enable signal in a current frame is greater than a non-effective duration of the enable signal in a previous frame.

It will noted that in some embodiments, the display data received by the currently scanned row of pixel circuits 30 is converted from the static picture data to the moving picture data, which means that the previously scanned row of pixel circuits 30, and rows of pixel circuits 30 located on a side of the previously scanned row of pixel circuits 30 away from the currently scanned row of pixel circuits 30 each receive the static picture data. The currently scanned row of pixel circuits 30, and rows of pixel circuits 30 located on a side of the currently scanned row of pixel circuits 30 away from the previously scanned row of pixel circuits 30 each receive the moving picture data.

In order to understand the scene visually, as shown in FIG. 13, a static sky and white clouds are located above, and a moving car relative to the sky and white clouds is located below. In this case, a picture formed by sub-pixels P that are electrically connected to the first EOA register Ex and EOA registers located on a side of the first EOA register Ex away from the second EOA register Ey corresponds to the static sky and white clouds, and a picture formed by sub-pixels P that are electrically connected to the second EOA register Ey and EOA registers located on a side of the second EOA register Ey away from the first EOA register Ex corresponds to the moving car.

In the pulse width adjustment phase P4, the method for controlling each EOA register includes: transmitting, by the pulse width adjustment circuit 50 in the second EOA register Ey, the signal output from the input circuit 40 to the pull-up node Q under the control of the enable signal from the enable signal terminal EN in the current frame.

Then, in the second charging phase P5, the method for controlling each EOA register includes: outputting, by the pull-up circuit 60, the voltage of the first voltage terminal VGH to the signal output terminal Output under the control of the pull-up node Q. In this case, as shown in FIG. 13, a non-effective duration Ty of a light-emitting signal EMy output from a signal output terminal Output of the second EOA register Ey is greater than a non-effective time Tx of a light-emitting signal EMx output from a signal output terminal Output of the first EOA register.

It can be seen from the above that the non-effective duration of the light-emitting signal required by the sub-pixels P corresponding to the moving picture is greater than the non-effective duration of the light-emitting signal required by the sub-pixels P corresponding to the static picture. In this embodiment, through the pulse width adjustment phase P4, the non-effective duration of the enable signal in the current frame is greater than the non-effective duration of the enable signal in the previous frame, so that the non-effective duration Ty of the light-emitting signal EMy output from the second EOA register Ey is greater than the non-effective duration Tx of the light-emitting signal EMx output from the first EOA register Ex. Moreover, the second EOA register is electrically connected to the sub-pixels P for displaying the moving picture, and the first EOA register Ex is electrically connected to the sub-pixels P for displaying the static picture. Therefore, through the above solution, the display apparatus 100 may display a static picture and a moving picture in an image frame, and in a case where the static picture is located above the moving picture, a non-effective duration of a light-emitting signal required by each pixel circuit 30 may be satisfied, thereby prolonging the service life of the product, reducing the moving picture response time MPRT, and reducing the occurrence probability of the dynamic afterimage.

It will be noted that in the above embodiments, the pixel circuits 30 in the display pictures shown in FIG. 13 are scanned row by row from top to bottom.

Figure 14A:
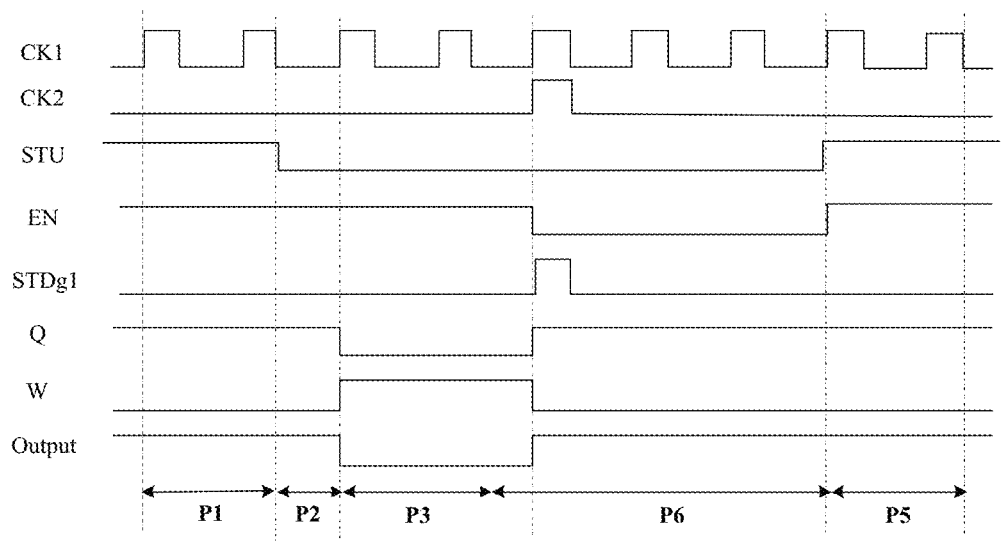
FIG. 14A is another timing diagram corresponding to the light-emitting control shift register shown in FIG. 5.
Figure 14B:
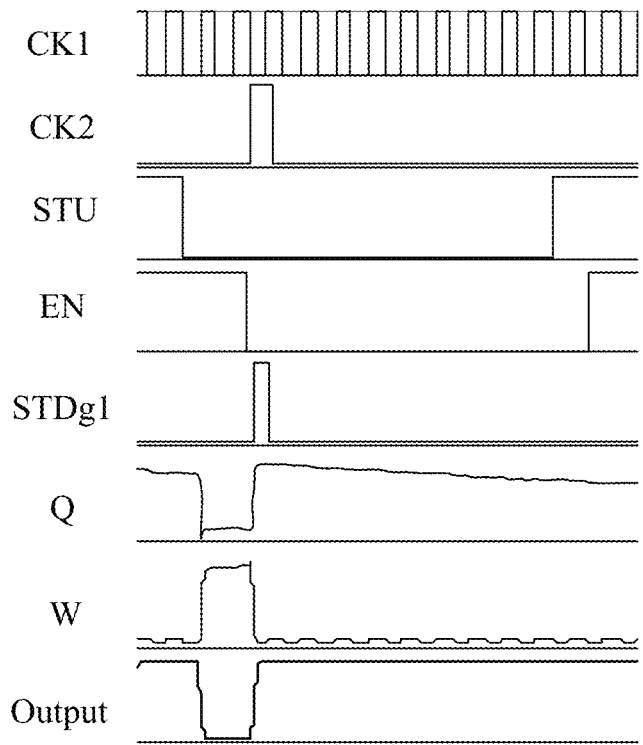
FIG. 14B is a simulation effect diagram of the light-emitting control shift register shown in FIG. 5 according to the timing diagram shown in FIG. 14A.

In some other embodiments of the present disclosure, for the EOA register circuit shown in FIG. 5, timing waveforms as shown in FIG. 14A are provided. In order to verify the technical effect of the EOA register circuit shown in FIG. 5 in combination with the timing signals shown in FIG. 14A, a simulation experiment is performed. An experimental verification result is shown in FIG. 14B, and signal waveforms of the pull-up node Q and the node W in the EOA register circuit and an output result of the signal output terminal Output are obtained, which indicates that the EOA register circuit shown in FIG. 5 provided in the embodiment of the present disclosure may output an effective and correct signal waveform in combination with the timing signals shown in FIG. 14A.

Hereafter, how each transistor in the EOA register circuit shown in FIG. 5 is turned on or off in different phase of an image frame will be exemplarily described in detail in combination with the timing signals shown in FIG. 14A.

As shown in FIG. 14A, an image frame may include a first charging phase P1, a charging hold phase P2, a discharging phase P3, a pulse width adjustment phase P6, and a second charging phase P5. Processes of the first charging phase P1, the charging hold phase P2, the discharging phase P3 and the second charging phase P5 are similar to those described above, and will not be repeated here.

A difference is that in the pulse width adjustment phase P6, STU=0, CK2=1, EN=0, STDg1=1, and Output=1.

In this case, the pulse width adjustment circuit 50 outputs the signal of the second clock signal terminal CK2 to the pull-up node Q under the control of the signal from the second signal input terminal STDg1.

Figure 15:
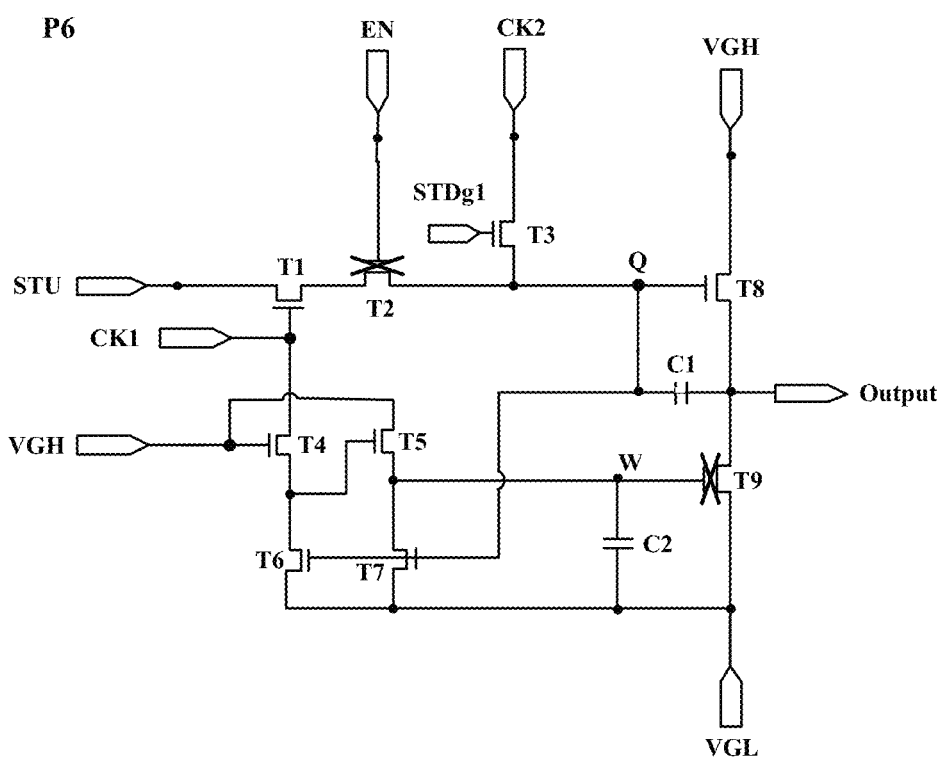
FIG. 15 is another equivalent circuit diagram of the light-emitting control shift register shown in FIG. 5 in a pulse width adjustment phase.

As shown in FIG. 15, the enable signal terminal EN outputs a low level signal, so that the second transistor T2 is turned off. Under a control of a high level signal output from the second signal input terminal STDg1, the third transistor T3 is turned on to transmit a high level signal output from the second clock signal terminal CK2 to the pull-up node Q, so as to charge the pull-up node Q, so that the potential of the pull-up node Q is increased, and the first capacitor C1 is charged. Under a control of the high level signal at the pull-up node Q, the eighth transistor T8 is turned on, so that the high level signal of the first voltage terminal VGH may be output to the signal output terminal Output.

It will be noted that in the pulse width adjustment phase P6, the second signal input terminal STDg1 needs to output only the high level signal, so that the third transistor T3 is turned on, and thus, the high level signal output from the second clock signal terminal CK2 is transmitted to the pull-up node Q to increase the potential of the pull-up node Q. Even in other phases except the pulse width adjustment phase P6, the second signal input terminal STDg1 and the second clock signal terminal CK2 each output a low level signal. However, in this case, the EOA register circuit has no discharge path, and therefore, the pull-up node Q may still be maintained at a high potential.

It can be seen from the above that in the pulse width adjustment phase P6, the signal output terminal Output of the EOA register outputs a high level signal, and after this high level signal is transmitted to the light-emitting control terminal EM of the pixel circuit 30, the pixel circuit 30 may be in the light-emitting phase L4 as shown in FIG. 3B. In this case, the OLED light-emitting device emits light.

It can be found that the signal output terminal Output of the EOA register output a high level signal in both the pulse width adjustment phase P6 and the second charging phase P5, and in this case, after this high level signal is transmitted to the light-emitting control terminal EM of the pixel circuit 30, the pixel circuit 30 is in the light-emitting phase L4 as shown in FIG. 3B. In this case, the OLED light-emitting device emits light.

It can be seen from the above that in a case where the EOA register shown in FIG. 5 is controlled by using the timing signals in FIG. 14A in an image frame, a non-effective duration of a light-emitting signal output from the signal output terminal Output of the EOA register is less than a duration of outputting a low level signal by the first signal input terminal STU. Moreover, a level signal output from the signal output terminal Output of a previous stage EOA register is input to the first signal input terminal STU. Thus, a non-effective duration of a light-emitting signal output from a current EOA register is less than a non-effective duration of a light-emitting signal output from a previous stage EOA register. The non-effective duration of the light-emitting signal output from the current EOA register may be controlled by the timing of supplying respective high level signals to the second signal input terminal STDg1 and the second clock signal terminal CK2 in the pulse width adjustment phase P6. In the pulse width adjustment phase P6, the earlier the timing of supplying the respective high level signals to the second signal input terminal STDg1 and the second clock signal terminal CK2, the smaller the non-effective duration of the light-emitting signal.

It can be seen from the above that the non-effective duration of the light-emitting signal output from the current EOA register may be less than the non-effective duration of the light-emitting signal output from the previous stage EOA register by using the EOA register circuit shown in FIG. 5 in combination with the timings shown in FIG. 14A. In this case, the light-emitting signal output from the current EOA register may serve as a light-emitting signal required for displaying a static picture, and the light-emitting signal output from the previous stage EOA register may serve as a light-emitting signal required for displaying a moving picture.

In this way, in an image frame, by using the EOA register circuit shown in FIG. 5 and the timing signals shown in FIG. 14A, the light-emitting signals with required non-effective durations are supplied to the sub-pixels P of the moving picture, and the light-emitting signals with required non-effective durations are supplied to the sub-pixels P of the static picture, so that the MPRT is reduced, the occurrence probability the dynamic afterimage is reduced, and the service life of the product is prolonged.

Figure 16:
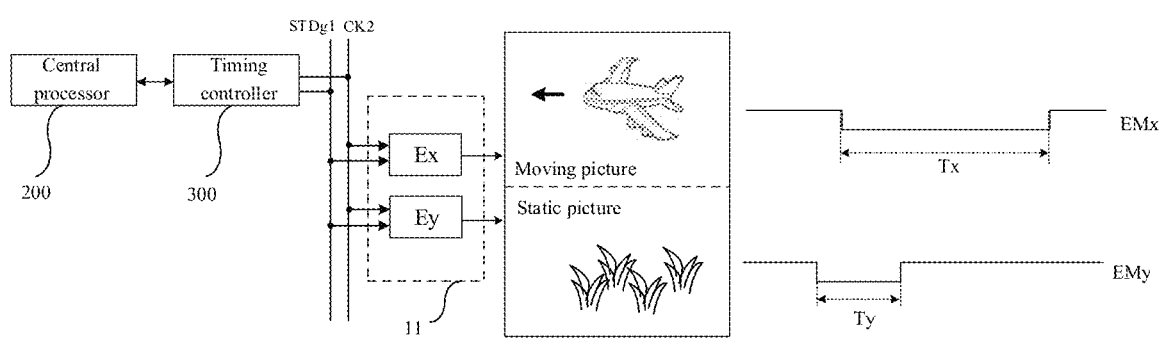
FIG. 16 is a diagram showing display pictures on a display apparatus, in accordance with some other embodiments.

Based on the same inventive concept, some other embodiments of the present disclosure further provide a method for controlling the display apparatus 100. As shown in FIG. 16, the first gate driving circuit 11 in the display apparatus 100 may include a first EOA register Ex and a second EOA register Ey. A first signal input terminal STU of the second EOA register Ey is electrically connected to a signal output terminal Output of the first EOA register Ex. A same row of pixel circuits 30 electrically connected to the second EOA register Ey is referred to as a currently scanned row of pixel circuits 30, and in this case, a same row of pixel circuits 30 electrically connected to the first EOA register Ex is referred to as a previously scanned row of pixel circuits 30.

Hereinafter, the method for controlling the display apparatus 100 will be exemplarily described. The control method includes the above method for controlling the EOA register (such as the timing waveforms in FIG. 14A). In the pulse width adjustment phase P6 in the above method for controlling the EOA register, before controlling each EOA register, the method for controlling the display apparatus 100 further includes following steps.

The central processor 200 determines that display data received by each row of pixel circuits is the moving picture data or the static picture data. The specific determination method is as described above, and will not be repeated here.

When display data received by the currently scanned row of pixel circuits 30 is converted from moving picture data to static picture data, for an EOA register electrically connected to the currently scanned row of pixel circuits, a second signal input terminal STDg1 is controlled to output an effective gating signal, and a second clock signal terminal CK2 is controlled to output an effective clock control signal.

It will be noted that since the N-type transistors are taken as an example in the embodiments of the present disclosure, the effective gating signal means that the gating signal in this case is a high level signal, and similarly, the effective clock control signal means that the clock control signal in this case is a high level signal.

In addition, the display data received by the currently scanned row of pixel circuits 30 is converted from the moving picture data to the static picture data, which means that the previously scanned row of pixel circuits 30, and rows of pixel circuits 30 located on a side of the previously scanned row of pixel circuits 30 away from the currently scanned row of pixel circuits 30 each receive the moving picture data. The currently scanned row of pixel circuits 30, and rows of pixel circuits 30 located on a side of the currently scanned row of pixel circuits 30 away from the previously scanned row of pixel circuits 30 each receive the static picture data.

In order to understand the scene visually, as shown in FIG. 16, a moving airplane is located above, and a static grass is located below. In this case, a picture formed by sub-pixels P that are electrically connected to the first EOA register Ex and EOA registers located on a side of the first EOA register Ex away from the second EOA register Ey corresponds to the moving airplane, and a picture formed by sub-pixels P that are electrically connected to the second EOA register Ey and EOA registers located on a side of the second EOA register Ey away from the first EOA register Ex corresponds to the static grass.

In the pulse width adjustment phase P6, the method for controlling each EOA register includes: outputting, by the pulse width adjustment circuit 50 in the second EOA register Ey, the clock control signal of the second clock signal terminal CK2 to the pull-up node Q under a control of the gating signal from the second signal input terminal STDg1 in a current frame.

Then, in the second charging phase P5, the method for controlling each light-emitting control shift register includes: outputting, by the pull-up circuit 60, the voltage of the first voltage terminal VGH to the signal output terminal Output under the control of the pull-up node Q. In this case, as shown in FIG. 16, a non-effective duration Ty of a light-emitting signal EMy output from a signal output terminal Output of the second EOA register Ey is less than a non-effective duration Tx of a light-emitting signal EMx output from a signal output terminal Output of the first EOA register Ex.

It can be seen from the above that the non-effective duration of the light-emitting signal required by the sub-pixels P corresponding to the static picture is less than the non-effective duration of the light-emitting signal required by the sub-pixels P corresponding to the moving picture. In this embodiment, the second signal input terminal STDg1 is controlled to output the effective gating signal, and the second clock signal terminal CK2 is controlled to output the effective clock control signal, so that the non-effective duration Ty of the light-emitting signal EMy output from the second EOA register Ey may be less than the non-effective duration Tx of the light-emitting signal EMx output from the first EOA register Ex. Moreover, the second EOA register is electrically connected to the sub-pixels P for displaying the static picture, and the first EOA register Ex is electrically connected to the sub-pixels P for displaying the moving picture. Therefore, through the above solution, when the display apparatus displays a static picture or a moving picture, a non-effective duration of a light-emitting signal required by each sub-pixel may be satisfied, thereby prolonging the service life of the product, reducing the moving picture response time MPRT, and reducing the occurrence probability of the dynamic afterimage.

It will be noted that in the above embodiments, the pixel circuits 30 in the display pictures shown in FIG. 16 are scanned row by row from top to bottom.

In some other embodiments of the present disclosure, in a case where the display pictures are complicated, such as "static picture 1-moving picture-static picture 2" or "moving picture 1-static picture-moving picture 2", the timing waveforms shown in FIGS. 7A and 14A may be applied to the EOA register circuit shown in FIG. 5, so that in an image frame, an effective duration of a light-emitting signal output from an EOA register at any position may be changed, thereby satisfying the complicated display pictures.

For example, if the display pictures include "static picture 1-moving picture-static picture 2", firstly, the timing controller 300 inputs an enable signal with an increased non-effective duration to the enable signal line EN in the pulse width adjustment phase P4, so that light-emitting signals with an increased non-effective duration are supplied to the moving picture in combination with the timings shown in FIG. 7A, thereby satisfying the light-emitting brightness and fluency of the moving picture cooperating with a large data signal Vdata. Next, the timing controller 300 inputs the respective high level signals to the second signal input terminal STDg1 and the second clock signal terminal CK2 synchronously in the pulse width adjustment phase P6, so that light-emitting signals with a reduced non-effective duration are supplied to the static picture 2 in combination with the timings shown in FIG. 14A, thereby satisfying the light-emitting brightness of the static picture 2 and the long service life of the sub-pixel P cooperating with a small data signal Vdata. The method of controlling the display apparatus 100 for displaying other complicated display pictures is similar to the above processes, and will not be repeated here.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting control shift register, comprising:
    an input circuit electrically connected to a first signal input terminal and a first clock signal terminal; wherein the input circuit is configured to output a signal of the first signal input terminal under a control of a signal from the first clock signal terminal;
    a pulse width adjustment circuit electrically connected to the input circuit, an enable signal terminal, a second signal input terminal, a second clock signal terminal and a pull-up node; wherein the pulse width adjustment circuit is configured to transmit the signal output from the input circuit to the pull-up node under a control of a signal from the enable signal terminal; and the pulse width adjustment circuit is further configured to output a signal of the second clock signal terminal to the pull-up node under a control of a signal from the second signal input terminal;
    a pull-up circuit electrically connected to the pull-up node, a first voltage terminal and a signal output terminal; wherein the pull-up circuit is configured to output a voltage of the first voltage terminal to the signal output terminal under a control of the pull-up node;
    a pull-down control circuit electrically connected to the first clock signal terminal, the first voltage terminal, the pull-up node and a second voltage terminal; wherein the pull-down control circuit is configured to output the voltage of the first voltage terminal under a control of signals from the pull-up node, the first clock signal terminal and the first voltage terminal; and the pull-down control circuit is further configured to output a voltage of the second voltage terminal under the control of the pull-up node; and
    a pull-down circuit electrically connected to the pull-down control circuit, the signal output terminal and the second voltage terminal; wherein the pull-down circuit is configured to pull down a voltage of the signal output terminal to the voltage of the second voltage terminal under a control of the voltage from the first voltage terminal.

2. The light-emitting control shift register according to claim 1, further comprising:
    a pull-up control circuit electrically connected to the first voltage terminal, the pull-up node and a pull-up control signal terminal; wherein the pull-up control circuit is configured to output the voltage of the first voltage terminal to the pull-up node under a control of a signal from the pull-up control signal terminal.

3. The light-emitting control shift register according to claim 2, wherein the pull-up control circuit includes:
    a tenth transistor; wherein a first electrode of the tenth transistor is electrically connected to the first voltage terminal, a second electrode of the tenth transistor is electrically connected to the pull-up node, and a gate of the tenth transistor is electrically connected to the pull-up control signal terminal.

4. A gate driving circuit, comprising N light-emitting control shift registers according to claim 2, wherein N is an integer greater than or equal to 2; wherein
    a first signal input terminal of a first stage light-emitting control shift register is electrically connected to a first start signal terminal; and
    a first signal input terminal of a light-emitting control shift register except the first stage light-emitting control shift register is electrically connected to a signal output terminal of a previous stage light-emitting control shift register.

5. A display apparatus, comprising:
    a plurality of pixel circuits arranged in an array; the pixel circuits each having a light-emitting control terminal and a gating signal terminal;
    a first gate driving circuit; wherein the first gate driving circuit is the gate driving circuit according to claim 4; a signal output terminal of each light-emitting control shift register in the first gate driving circuit is electrically connected to light-emitting control terminals in a same row of pixel circuits; and a second gate driving circuit including N gating control shift registers that are cascaded; wherein an output terminal of each gating control shift register is electrically connected to gating signal terminals in a same row of pixel circuits; N is an integer greater than or equal to 2;

wherein an output terminal of a gating control shift register except a first stage gating control shift register is electrically connected to a second signal input terminal of a previous stage light-emitting control shift register.

6. The light-emitting control shift register according to claim 1, wherein the input circuit includes:
a first transistor; wherein a first electrode of the first transistor is electrically connected to the first signal input terminal, and a gate of the first transistor is electrically connected to the first clock signal terminal.

7. The light-emitting control shift register according to claim 1, wherein the pulse width adjustment circuit includes:
a first pulse width adjustment sub-circuit electrically connected to the input circuit, the enable signal terminal and the pull-up node; wherein the first pulse width adjustment sub-circuit is configured to transmit the signal output from the input circuit to the pull-up node under the control of the signal from the enable signal terminal; and
a second pulse width adjustment sub-circuit electrically connected to the second signal input terminal, the second clock signal terminal and the pull-up node; wherein the second pulse width adjustment sub-circuit is configured to output the signal of the second clock signal terminal to the pull-up node under the control of the signal from the second signal input terminal.

8. The light-emitting control shift register according to claim 7, wherein the input circuit includes a first transistor, a first electrode of the first transistor is electrically connected to the first signal input terminal, and a gate of the first transistor is electrically connected to the first clock signal terminal; the first pulse width adjustment sub-circuit includes:
a second transistor; wherein a first electrode of the second transistor is electrically connected to a second electrode of the first transistor, a second electrode of the second transistor is electrically connected to the pull-up node, and a gate of the second transistor is electrically connected to the enable signal terminal.

9. The light-emitting control shift register according to claim 7, wherein the second pulse width adjustment sub-circuit includes:
a third transistor; wherein a first electrode of the third transistor is electrically connected to the second clock signal terminal, a second electrode of the third transistor is electrically connected to the pull-up node, and a gate of the third transistor is electrically connected to the second signal input terminal.

10. The light-emitting control shift register according to claim 1, wherein the pull-down control circuit includes a first pull-down control sub-circuit and a second pull-down control sub-circuit;
the first pull-down control sub-circuit is electrically connected to the first clock signal terminal, the first voltage terminal and the second pull-down control sub-circuit; wherein the first pull-down control sub-circuit is configured to output the voltage of the first voltage terminal under a control of the signals from the first clock signal terminal and the first voltage terminal when the second pull-down control sub-circuit is turned off; and the second pull-down control sub-circuit is further electrically connected to the pull-up node and the second voltage terminal; wherein the second pull-down control sub-circuit is configured to be turned off under a control of the signal from the pull-up node, and output the voltage of the second voltage terminal under the control of the pull-up node.

11. The light-emitting control shift register according to claim 10, wherein the first pull-down control sub-circuit includes:
a fourth transistor; wherein a first electrode of the fourth transistor is electrically connected to the first clock signal terminal, and a gate of the fourth transistor is electrically connected to the first voltage terminal; and
a fifth transistor; wherein a first electrode of the fifth transistor is electrically connected to the first voltage terminal, and a gate of the fifth transistor is electrically connected to a second electrode of the fourth transistor.

12. The light-emitting control shift register according to claim 11, wherein the second pull-down control sub-circuit includes:
a sixth transistor; wherein a first electrode of the sixth transistor is electrically connected to the second electrode of the fourth transistor, a second electrode of the sixth transistor is electrically connected to the second voltage terminal, and a gate of the sixth transistor is electrically connected to the pull-up node; and
a seventh transistor; wherein a first electrode of the seventh transistor is electrically connected to a second electrode of the fifth transistor, a second electrode of the seventh transistor is electrically connected to the second voltage terminal, and a gate of the seventh transistor is electrically connected to the pull-up node.

13. The light-emitting control shift register according to claim 11, wherein the pull-down circuit includes:
a ninth transistor; wherein a first electrode of the ninth transistor is electrically connected to the second voltage terminal, a second electrode of the ninth transistor is electrically connected to the signal output terminal, and a gate of the ninth transistor is electrically connected to a second electrode of the fifth transistor; and
a second capacitor; wherein a first electrode of the second capacitor is electrically connected to the gate of the ninth transistor, and a second electrode of the second capacitor is electrically connected to the second voltage terminal.

14. The light-emitting control shift register according to claim 1, wherein the pull-up circuit includes:
an eighth transistor; wherein a first electrode of the eighth transistor is electrically connected to the first voltage terminal, a second electrode of the eighth transistor is electrically connected to the signal output terminal, and a gate of the eighth transistor is electrically connected to the pull-up node; and
a first capacitor; wherein a first electrode of the first capacitor is electrically connected to the pull-up node, and a second electrode of the first capacitor is electrically connected to the signal output terminal.

15. A gate driving circuit, comprising N light-emitting control shift registers according to claim 1, wherein N is an integer greater than or equal to 2; wherein
a first signal input terminal of a first stage light-emitting control shift register is electrically connected to a first start signal terminal; and
a first signal input terminal of a light-emitting control shift register except the first stage light-emitting control shift register is electrically connected to a signal output terminal of a previous stage light-emitting control shift register.

16. A display apparatus, comprising:
a plurality of pixel circuits arranged in an array; the pixel circuits each having a light-emitting control terminal and a gating signal terminal;
a first gate driving circuit; wherein the first gate driving circuit is the gate driving circuit according to claim 15; a signal output terminal of each light-emitting control shift register in the first gate driving circuit is electrically connected to light-emitting control terminals in a same row of pixel circuits; and
a second gate driving circuit including N gating control shift registers that are cascaded; wherein an output terminal of each gating control shift register is electrically connected to gating signal terminals in a same row of pixel circuits; N is an integer greater than or equal to 2;
wherein an output terminal of a gating control shift register except a first stage gating control shift register is electrically connected to a second signal input terminal of a previous stage light-emitting control shift register.

17. The display apparatus according to claim 16, wherein further comprising:
a central processor for obtaining moving picture data and static picture data of an image to be displayed; and
a timing controller for supplying each light-emitting control shift register with input signals, an enable signal and a clock control signal according to the moving picture data and the static picture data.

18. A method for controlling the display apparatus according to claim 16, comprising a method for controlling each light-emitting control shift register; wherein an image frame includes a first charging phase, a charging hold phase, a discharging phase, a pulse width adjustment phase and a second charging phase, and the method for controlling each light-emitting control shift register includes:
in the first charging phase, outputting, by the input circuit, the signal of the first signal input terminal under the control of the signal from the first clock signal terminal; transmitting, by the pulse width adjustment circuit, the signal output from the input circuit to the pull-up node under the control of the signal from the enable signal terminal; outputting, by the pull-up circuit, the voltage of the first voltage terminal to the signal output terminal under the control of the pull-up node;
in the charging hold phase, continuously outputting, by the pull-up circuit, the voltage of the first voltage terminal to the signal output terminal under the control of the pull-up node;
in the discharging phase, outputting, by the input circuit, the signal of the first signal input terminal under the control of the signal from the first clock signal terminal; transmitting, by the pulse width adjustment circuit, the signal output from the input circuit to the pull-up node under the control of the signal from the enable signal terminal; outputting, by the pull-down control circuit, the voltage of the first voltage terminal under the control of the signals from the pull-up node, the first clock signal terminal and the first voltage terminal; pulling down, by the pull-down circuit, the voltage of the signal output terminal to the voltage of the second voltage terminal under the control of the voltage from the first voltage terminal;

in the pulse width adjustment phase, transmitting, by the pulse width adjustment circuit, the signal output from the input circuit to the pull-up node under the control of the signal from the enable signal terminal; further outputting, by the pulse width adjustment circuit, the signal of the second clock signal terminal to the pull-up node under the control of the signal from the second signal input terminal; and
in the second charging phase, outputting, by the input circuit, the signal of the first signal input terminal under the control of the signal from the first clock signal terminal; transmitting, by the pulse width adjustment circuit, the signal output from the input circuit to the pull-up node under the control of the signal from the enable signal terminal; outputting, by the pull-up circuit, the voltage of the first voltage terminal to the signal output terminal under the control of the pull-up node;
in the pulse width adjustment phase, before controlling each light-emitting control shift register, the method for controlling the display apparatus further comprises:
determining that display data received by each row of pixel circuits is moving picture data or static picture data; and
when display data received by a currently scanned row of pixel circuits is converted from static picture data to moving picture data, adjusting a pulse width of an enable signal supplied to a light-emitting control shift register electrically connected to the currently scanned row of pixel circuits, so that a non-effective duration of the enable signal in a current frame is greater than a non-effective duration of the enable signal in a previous frame;
in the pulse width adjustment phase, the method for controlling each light-emitting control shift register includes:
in the current frame, for the light-emitting control shift register electrically connected to the currently scanned row of pixel circuits, transmitting, by a pulse width adjustment circuit, the signal output from an input circuit to a pull-up node under a control of the enable signal from an enable signal terminal; and
in the second charging phase, the method for controlling each light-emitting control shift register includes:
for each light-emitting control shift register, outputting, by a pull-up circuit, a voltage of a first voltage terminal to the signal output terminal under a control of a pull-up node, so that a non-effective duration of a signal output from a signal output terminal of the light-emitting control shift register electrically connected to the currently scanned row of pixel circuits is greater than a non-effective duration of a signal output from a signal output terminal of a light-emitting control shift register electrically connected to a previously scanned row of pixel circuits.

19. A method for controlling the display apparatus according to claim 16, comprising a method for controlling each light-emitting control shift register; wherein an image frame includes a first charging phase, a charging hold phase, a discharging phase, a pulse width adjustment phase and a second charging phase, and the method for controlling each light-emitting control shift register includes:
in the first charging phase, outputting, by the input circuit, the signal of the first signal input terminal under the control of the signal from the first clock signal terminal; transmitting, by the pulse width adjustment circuit, the signal output from the input circuit to the pull-up node under the control of the signal from the enable signal terminal; outputting, by the pull-up circuit, the voltage of the first voltage terminal to the signal output terminal under the control of the pull-up node;
in the charging hold phase, continuously outputting, by the pull-up circuit, the voltage of the first voltage terminal to the signal output terminal under the control of the pull-up node;
in the discharging phase, outputting, by the input circuit, the signal of the first signal input terminal under the control of the signal from the first clock signal terminal; transmitting, by the pulse width adjustment circuit, the signal output from the input circuit to the pull-up node under the control of the signal from the enable signal terminal; outputting, by the pull-down control circuit, the voltage of the first voltage terminal under the control of the signals from the pull-up node, the first clock signal terminal and the first voltage terminal; pulling down, by the pull-down circuit, the voltage of the signal output terminal to the voltage of the second voltage terminal under the control of the voltage from the first voltage terminal;
in the pulse width adjustment phase, transmitting, by the pulse width adjustment circuit, the signal output from the input circuit to the pull-up node under the control of the signal from the enable signal terminal; further outputting, by the pulse width adjustment circuit, the signal of the second clock signal terminal to the pull-up node under the control of the signal from the second signal input terminal; and
in the second charging phase, outputting, by the input circuit, the signal of the first signal input terminal under the control of the signal from the first clock signal terminal; transmitting, by the pulse width adjustment circuit, the signal output from the input circuit to the pull-up node under the control of the signal from the enable signal terminal; outputting, by the pull-up circuit, the voltage of the first voltage terminal to the signal output terminal under the control of the pull-up node;

in the pulse adjustment phase, before controlling each light-emitting control shift register, the method for controlling the display apparatus further comprises:
determining that display data received by each row of pixel circuits is moving picture data or static picture data; and
when display data received by a currently scanned row of pixel circuits is converted from moving picture data to static picture data, for a light-emitting control shift register electrically connected to the currently scanned row of pixel circuits, controlling a second signal input terminal to output an effective gating signal and a second clock signal terminal to output an effective clock control signal;

in the pulse width adjustment phase, the method for controlling each light-emitting control shift register includes:
in a current frame, for the light-emitting control shift register electrically connected to the currently scanned row of pixel circuits, outputting, by a pulse width adjustment circuit, the clock control signal of the second clock signal terminal to a pull-up node under a control of the gating signal from the second signal input terminal; and in the second charging phase, the method for controlling each light-emitting control shift register includes:

for each light-emitting control shift register, outputting, by a pull-up circuit, a voltage of a first voltage terminal to the signal output terminal under a control of a pull-up node, so that a non-effective duration of a signal output from a signal output terminal of the light-emitting control shift register electrically connected to the currently scanned row of pixel circuits is less than a non-effective duration of a signal output from a signal output terminal of a light-emitting control shift register electrically connected to a previously scanned row of pixel circuits.

20. A method for controlling the light-emitting control shift register according to claim 1, wherein an image frame includes a first charging phase, a charging hold phase, a discharging phase, a pulse width adjustment phase and a second charging phase; the method for controlling the light-emitting control shift register comprises:
in the first charging phase, outputting, by the input circuit, the signal of the first signal input terminal under the control of the signal from the first clock signal terminal; transmitting, by the pulse width adjustment circuit, the signal output from the input circuit to the pull-up node under the control of the signal from the enable signal terminal; outputting, by the pull-up circuit, the voltage of the first voltage terminal to the signal output terminal under the control of the pull-up node;
in the charging hold phase, continuously outputting, by the pull-up circuit, the voltage of the first voltage terminal to the signal output terminal under the control of the pull-up node;
in the discharging phase, outputting, by the input circuit, the signal of the first signal input terminal under the control of the signal from the first clock signal terminal; transmitting, by the pulse width adjustment circuit, the signal output from the input circuit to the pull-up node under the control of the signal from the enable signal terminal; outputting, by the pull-down control circuit, the voltage of the first voltage terminal under the control of the signals from the pull-up node, the first clock signal terminal and the first voltage terminal; pulling down, by the pull-down circuit, the voltage of the signal output terminal to the voltage of the second voltage terminal under the control of the voltage from the first voltage terminal;
in the pulse width adjustment phase, transmitting, by the pulse width adjustment circuit, the signal output from the input circuit to the pull-up node under the control of the signal from the enable signal terminal; further outputting, by the pulse width adjustment circuit, the signal of the second clock signal terminal to the pull-up node under the control of the signal from the second signal input terminal; and
in the second charging phase, outputting, by the input circuit, the signal of the first signal input terminal under the control of the signal from the first clock signal terminal; transmitting, by the pulse width adjustment circuit, the signal output from the input circuit to the pull-up node under the control of the signal from the enable signal terminal; outputting, by the pull-up circuit, the voltage of the first voltage terminal to the signal output terminal under the control of the pull-up node.

* * * * *